(12) United States Patent
Sridharan et al.

(10) Patent No.: US 12,279,238 B2
(45) Date of Patent: Apr. 15, 2025

(54) INTERLEAVER DESIGN FOR MULTI-SLOT UPLINK SHARED CHANNEL TRANSMISSION

(71) Applicant: QUALCOMM Incorporated, San Diego, CA (US)

(72) Inventors: Gokul Sridharan, Sunnyvale, CA (US); Seyedkianoush Hosseini, San Diego, CA (US); Hung Dinh Ly, San Diego, CA (US); Peter Gaal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 498 days.

(21) Appl. No.: 17/655,655

(22) Filed: Mar. 21, 2022

(65) Prior Publication Data
US 2022/0303987 A1    Sep. 22, 2022

Related U.S. Application Data

(60) Provisional application No. 63/164,464, filed on Mar. 22, 2021.

(51) Int. Cl.
*H04W 72/0446*  (2023.01)

(52) U.S. Cl.
CPC .............. *H04W 72/0446* (2013.01)

(58) Field of Classification Search
CPC ........... H04W 72/0446; H04L 1/0057; H04L 1/0067; H04L 5/0044; H04L 1/0041; H04L 1/0071; H04L 1/1819; H04L 1/1835; H03M 13/2707; H03M 13/6362; H03M 13/116
See application file for complete search history.

(56) References Cited

U.S. PATENT DOCUMENTS

| 2010/0260161 | A1* | 10/2010 | Van Veen | H03M 13/2703 |
| | | | | 370/342 |
| 2012/0082075 | A1* | 4/2012 | Luo | H04L 1/0071 |
| | | | | 370/310 |
| 2018/0294917 | A1* | 10/2018 | Loncke | H04L 1/0013 |

(Continued)

FOREIGN PATENT DOCUMENTS

| EP | 3958488 A1 | 2/2022 |
| WO | WO-2021018277 | 2/2021 |

OTHER PUBLICATIONS

International Search Report and Written Opinion—PCT/US2022/071259—ISA/EPO—Jul. 6, 2022.

(Continued)

*Primary Examiner* — Rina C Pancholi
(74) *Attorney, Agent, or Firm* — Paul M. McAdams; Harrity & Harrity, LLP

(57) ABSTRACT

Various aspects of the present disclosure generally relate to wireless communication. In some aspects, a user equipment (UE) may select, for a communication on a multi-slot transmission occasion, coded bits of a plurality of coded bits on a per slot basis, for each of multiple slots of the multi-slot transmission occasion. The UE may interleave the coded bits on a per slot basis to form one or more interleaved encoded bit sequences of a codeblock. The UE may transmit the communication including the one or more interleaved encoded bit sequences. Numerous other aspects are provided.

28 Claims, 13 Drawing Sheets

(56) References Cited

U.S. PATENT DOCUMENTS

2022/0045789 A1* 2/2022 Karmoose ......... H04W 72/1268

OTHER PUBLICATIONS

Qualcomm Incorporated: "TB Processing Over Multi-Slot PUSCH", 3GPP Draft, 3GPP TSG-RAN WG1 Meeting #106bis-e, R1-2110202, 3rd Generation Partnership Project (3GPP), Mobile Competence Centre, 650, Route Des Lucioles, F-06921 Sophia-Antipolis Cedex, France, vol. RAN WG1, No. e-Meeting, Oct. 11, 2021-Oct. 19, 2021, Oct. 2, 2021 (Oct. 2, 2021), XP052059138, 11 Pages, Retrieved from the Internet: URL: https://ftp.3gpp.org/tsg_ran/WG1_RL1/TSGR1_106b-e/Docs/R1-2110202.zip R1-2110202 TB Processing Over Multi-Slot PUSCH.docx [Retrieved on Oct. 2, 2021] Section 2.

Samsung: "TB Processing Over Multi-Slot PUSCH", 3GPP TSG RAN WG1 #104-e, R1-2101222, 3rd Generation Partnership Project, Mobile Competence Centre, 650, Route Des Lucioles, F-06921 Sophia-Antipolis Cedex, France, vol. RAN WG1, No. e-Meeting, Jan. 25, 2021-Feb. 5, 2021, Jan. 19, 2021, XP051971435, 5 Pages, Section 2.

* cited by examiner

INTERLEAVER DESIGN FOR MULTI-SLOT UPLINK SHARED CHANNEL TRANSMISSION

CROSS-REFERENCE TO RELATED APPLICATION

This patent application claims priority to U.S. Provisional Patent Application No. 63/164,464, filed on Mar. 22, 2021, entitled "INTERLEAVER DESIGN FOR MULTI-SLOT UPLINK SHARED CHANNEL TRANSMISSION," and assigned to the assignee hereof. The disclosure of the prior application is considered part of and is incorporated by reference into this patent application in its entirety.

FIELD OF THE DISCLOSURE

Aspects of the present disclosure generally relate to wireless communication and specifically, to techniques and apparatuses for interleaver design for multi-slot uplink shared channel transmission.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (for example, bandwidth or transmit power). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

The above multiple access technologies have been adopted in various telecommunication standards to provide a common protocol that enables different user equipments (UEs) to communicate on a municipal, national, regional, and even global level. New Radio (NR), which may also be referred to as 5G, is a set of enhancements to the LTE mobile standard promulgated by the 3GPP. NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM or SC-FDMA (for example, also known as discrete Fourier transform spread OFDM (DFT-s-OFDM)) on the uplink (UL), as well as supporting beamforming, multiple-input multiple-output (MIMO) antenna technology, and carrier aggregation. However, as the demand for mobile broadband access continues to increase, there exists a need for further improvements in LTE and NR technologies. Preferably, these improvements are applicable to other multiple access technologies and the telecommunication standards that employ these technologies.

In some situations, it may be beneficial for a UE to use an interleaver process to vary the bits of a wireless transmission in an effort to improve the performance and quality of the transmission. Some wireless transmissions may span multiple slots, such as a single physical uplink shared channel (PUSCH) transmitted on two or more contiguous slots, or a single PUSCH transmitted in two or more segments, each of which occupies two or more contiguous slots. While the interleaving process is designed to improve transmission performance, when a PUSCH or other transmission spans multiple slots, the interleaving process becomes more complex and less efficient.

SUMMARY

In some aspects, a method of wireless communication performed by a user equipment (UE) includes receiving an indication of one or more sets of contiguous time domain resources for a multi-slot transmission occasion that spans multiple slots. In some aspects, the method includes selecting, for a communication on the multi-slot transmission occasion, coded bits of a plurality of coded bits on one of: a per slot basis, for each of the multiple slots, or a per segment basis, for each of a plurality of segments, each segment including one of the one or more sets of contiguous time domain resources and spanning across at least two slots. In some aspects, the method includes interleaving the coded bits on one of a per slot basis or a per segment basis to form one or more interleaved encoded bit sequences of a codeblock. In some aspects, the method includes transmitting the communication including the one or more interleaved encoded bit sequences.

In some aspects, a method of wireless communication performed by a base station includes transmitting an indication of one or more sets of contiguous time domain resources for a multi-slot transmission occasion that spans multiple slots. In some aspects, the method includes receiving, on the multi-slot transmission occasion, a communication including an interleaved encoded bit sequence of a codeblock. In some aspects, the method includes demapping the codeblock to obtain soft information for each of a plurality of transmitted bits. In some aspects, the method includes de-interleaving, to obtain de-interleaved soft information, the soft information on one of: a per slot basis, for each of the multiple slots, or a per segment basis, for each of a plurality of segments, each segment including one of the one or more sets of contiguous time domain resources and spanning across at least two slots. In some aspects, the method includes concatenating the de-interleaved soft information to obtain concatenated soft information. In some aspects, the method includes decoding the concatenated soft information to infer one or more codeblocks of the communication.

In some aspects, a non-transitory computer-readable medium storing a set of instructions for wireless communication includes one or more instructions that, when executed by one or more processors of a UE, cause the UE to: receive an indication of one or more sets of contiguous time domain resources for a multi-slot transmission occasion that spans multiple slots. The one or more instructions may cause the UE to select, for a communication on the multi-slot transmission occasion, coded bits of a plurality of coded bits on one of: a per slot basis, for each of the multiple slots, or a per segment basis, for each of a plurality of segments, each segment including one of the one or more sets of contiguous time domain resources and spanning across at least two slots. The one or more instructions may cause the UE to interleave the coded bits on one of a per slot basis or a per segment basis to form one or more interleaved encoded bit sequences of a codeblock. The one or more instructions may cause the UE to transmit the communication including the one or more interleaved encoded bit sequences.

In some aspects, a non-transitory computer-readable medium storing a set of instructions for wireless communication includes one or more instructions that, when executed by one or more processors of a base station, cause the base station to transmit an indication of one or more sets of contiguous time domain resources for a multi-slot transmission occasion that spans multiple slots. The one or more instructions may cause the base station to receive, on the multi-slot transmission occasion, a communication including an interleaved encoded bit sequence of a codeblock. The one or more instructions may cause the base station to demap the codeblock to obtain soft information for each of a plurality of transmitted bits. The one or more instructions may cause the base station to de-interleave, to obtain de-interleaved soft information, the soft information on one of: a per slot basis, for each of the multiple slots, or a per segment basis, for each of a plurality of segments, each segment including one of the one or more sets of contiguous time domain resources and spanning across at least two slots. The one or more instructions may cause the base station to concatenate the de-interleaved soft information to obtain concatenated soft information; and decode the concatenated soft information to infer one or more codeblocks of the communication.

In some aspects, an apparatus for wireless communication includes means for receiving an indication of one or more sets of contiguous time domain resources for a multi-slot transmission occasion that spans multiple slots. In some aspects, the apparatus includes means for selecting, for a communication on the multi-slot transmission occasion, coded bits of a plurality of coded bits on one of: a per slot basis, for each of the multiple slots, or a per segment basis, for each of a plurality of segments, each segment including one of the one or more sets of contiguous time domain resources and spanning across at least two slots. In some aspects, the apparatus includes means for interleaving the coded bits on one of a per slot basis or a per segment basis to form one or more interleaved encoded bit sequences of a codeblock. In some aspects, the apparatus includes means for transmitting the communication including the one or more interleaved encoded bit sequences.

In some aspects, an apparatus for wireless communication includes means for transmitting an indication of one or more sets of contiguous time domain resources for a multi-slot transmission occasion that spans multiple slots. In some aspects, the apparatus includes means for receiving, on the multi-slot transmission occasion, a communication including an interleaved encoded bit sequence of a codeblock. In some aspects, the apparatus includes means for demapping the codeblock to obtain soft information for each of a plurality of transmitted bits. In some aspects, the apparatus includes means for de-interleaving, to obtain de-interleaved soft information, the soft information on one of: a per slot basis, for each of the multiple slots, or a per segment basis, for each of a plurality of segments, each segment including one of the one or more sets of contiguous time domain resources and spanning across at least two slots. In some aspects, the apparatus includes means for concatenating the de-interleaved soft information to obtain concatenated soft information. In some aspects, the apparatus includes means for decoding the concatenated soft information to infer one or more codeblocks of the communication.

In some aspects, a UE for wireless communication includes at least one processor; and at least one memory communicatively coupled with the at least one processor and storing processor-readable code that, when executed by the at least one processor, is configured to cause the UE to receive an indication of one or more sets of contiguous time domain resources for a multi-slot transmission occasion that spans multiple slots. The processor-readable code, when executed by the at least one processor, may be configured to cause the UE to select, for a communication on the multi-slot transmission occasion, coded bits of a plurality of coded bits on one of: a per slot basis, for each of the multiple slots, or a per segment basis, for each of a plurality of segments, each segment including one of the one or more sets of contiguous time domain resources and spanning across at least two slots. The processor-readable code, when executed by the at least one processor, may be configured to cause the UE to interleave the coded bits on one of a per slot basis or a per segment basis to form one or more interleaved encoded bit sequences of a codeblock. The processor-readable code, when executed by the at least one processor, may be configured to cause the UE to transmit the communication including the one or more interleaved encoded bit sequences.

In some aspects, a base station for wireless communication includes at least one processor; and at least one memory communicatively coupled with the at least one processor and storing processor-readable code that, when executed by the at least one processor, is configured to cause the base station to transmit an indication of one or more sets of contiguous time domain resources for a multi-slot transmission occasion that spans multiple slots. The processor-readable code, when executed by the at least one processor, may be configured to cause the UE to receive, on the multi-slot transmission occasion, a communication including an interleaved encoded bit sequence of a codeblock. The processor-readable code, when executed by the at least one processor, may be configured to cause the UE to demap the codeblock to obtain soft information for each of a plurality of transmitted bits. The processor-readable code, when executed by the at least one processor, may be configured to cause the UE to de-interleave, to obtain de-interleaved soft information, the soft information on one of: a per slot basis, for each of the multiple slots, or a per segment basis, for each of a plurality of segments, each segment including one of the one or more sets of contiguous time domain resources and spanning across at least two slots. The processor-readable code, when executed by the at least one processor, may be configured to cause the UE to concatenate the de-interleaved soft information to obtain concatenated soft information. The processor-readable code, when executed by the at least one processor, may be configured to cause the UE to decode the concatenated soft information to infer one or more codeblocks of the communication.

Aspects generally include a method, apparatus, system, computer program product, non-transitory computer-readable medium, user equipment, base station, wireless communication device, or processing system as substantially described with reference to and as illustrated by the drawings and specification.

The foregoing has outlined rather broadly the features and technical advantages of examples in accordance with the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only some typical aspects of this disclosure and are therefore not to be considered limiting of its scope, for the description may admit to other equally effective aspects. The same reference numbers in different drawings may identify the same or similar elements.

DETAILED DESCRIPTION

Figure 1:
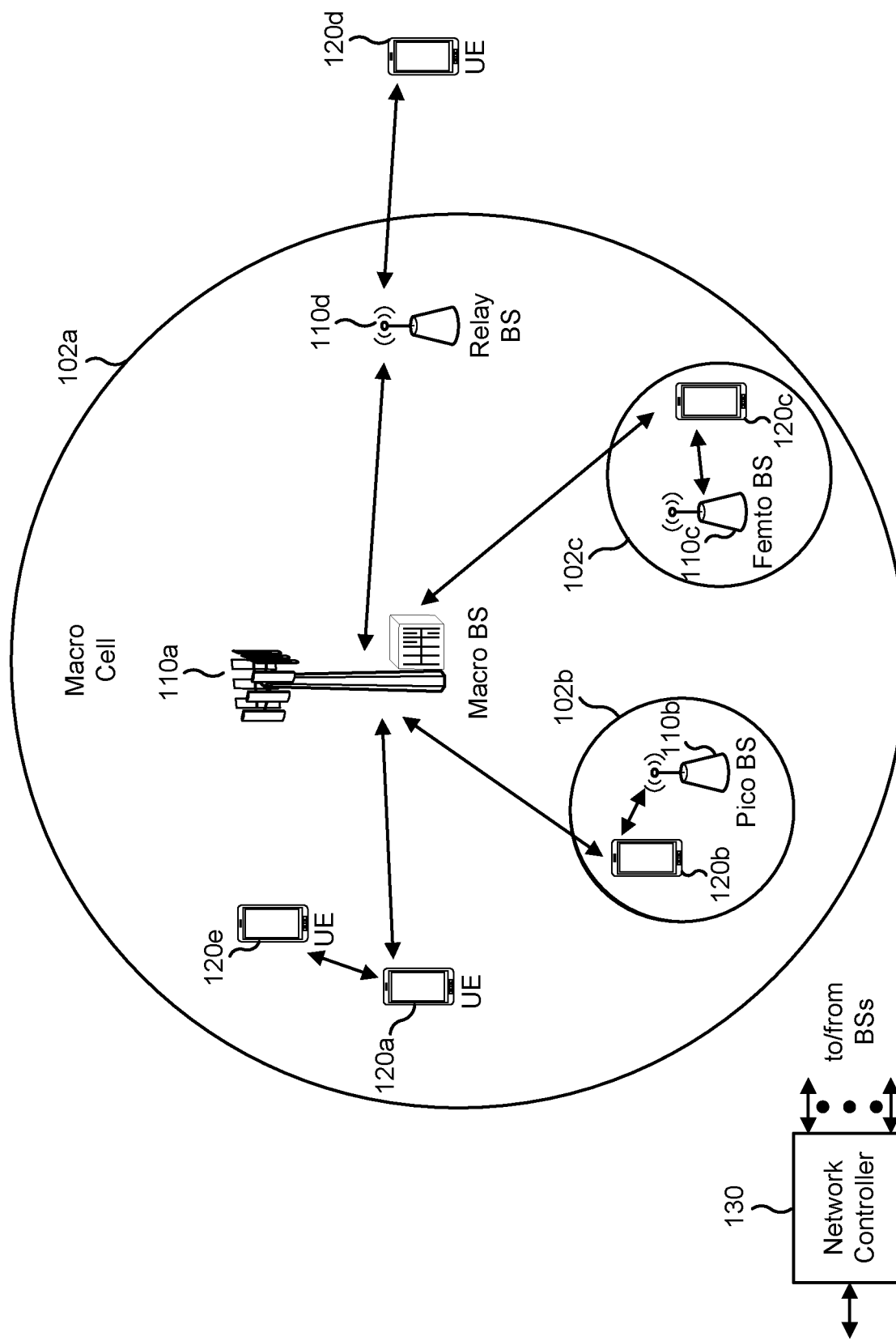
FIG. 1 is a diagram illustrating an example of a wireless network in accordance with the present disclosure.

Various aspects of the disclosure are described more fully hereinafter with reference to the accompanying drawings. This disclosure may, however, be embodied in many different forms and are not to be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art may appreciate that the scope of the disclosure is intended to cover any aspect of the disclosure disclosed herein, whether implemented independently of or combined with any other aspect of the disclosure. For example, an apparatus may be implemented or a method may be practiced using any quantity of the aspects set forth herein. In addition, the scope of the disclosure is intended to cover such an apparatus or method which is practiced using other structure, functionality, or structure and functionality in addition to or other than the various aspects of the disclosure set forth herein. Any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, or algorithms (collectively referred to as "elements"). These elements may be implemented using hardware, software, or a combination of hardware and software. Whether such elements are implemented as hardware or software depends upon the particular application and design constraints imposed on the overall system.

Various aspects relate generally to codeblock interleaving for multi-slot uplink shared channel transmissions on a per slot or per segment basis. Some aspects more specifically relate to selecting, for a physical uplink shared channel (PUSCH) transmission communication that spans multiple slots, coded bits on a per slot or per segment basis, and interleaving the coded bits on the per slot or per segment basis. In some aspects, for PUSCH transmission occasions that span multiple slots, a UE may interleave bits of the PUSCH for each of the multiple slots. In some aspects, for PUSCH transmission occasions that span multiple segments, each including a respective set of contiguous slots, a UE may interleave bits of the PUSCH for each set of contiguous slots.

Particular aspects of the subject matter described in this disclosure can be implemented to realize one or more of the following potential advantages. In some examples, per-slot or per-segment interleaving provide for more efficient uplink control information (UCI) multiplexing on the PUSCH. In some examples, the described techniques can be used to reduce the latencies involved in the decision making process related to UCI multiplexing. In some examples, the described techniques can be used to improve the quality and performance of network transmissions, such as PUSCH or other transmissions that span multiple slots. In addition, the use of codeblock interleaving for multi-slot uplink shared channel transmissions on a per slot or per segment basis may reduce the complexity of current UE interleaving processes and provides efficiency improvements for a UE, which may enable the UE to more efficiently consume power, communication, network, and computing resources.

FIG. 1 is a diagram illustrating an example of a wireless network in accordance with the present disclosure. The wireless network may be or may include elements of a 5G (NR) network or an LTE network, among other examples. The wireless network may include one or more base stations 110 (shown as BS 110a, BS 110b, BS 110c, and BS 110d) and other network entities. A base station (BS) is an entity that communicates with user equipment (UEs) and may also be referred to as an NR BS, a Node B, a gNB, a 5G node B (NB), an access point, or a transmit receive point (TRP), among other examples. Each BS may provide communication coverage for a particular geographic area. In 3GPP, the term "cell" can refer to a coverage area of a BS or a BS subsystem serving this coverage area, depending on the context in which the term is used.

A BS may provide communication coverage for a macro cell, a pico cell, a femto cell, or another type of cell. A macro cell may cover a relatively large geographic area (for example, several kilometers in radius) and may allow unrestricted access by UEs with service subscription. A pico cell may cover a relatively small geographic area and may allow unrestricted access by UEs with service subscription. A femto cell may cover a relatively small geographic area (for example, a home) and may allow restricted access by UEs having association with the femto cell (for example, UEs in a closed subscriber group (CSG)). A BS for a macro cell may be referred to as a macro BS. A BS for a pico cell may be referred to as a pico BS. A BS for a femto cell may be referred to as a femto BS or a home BS. A BS may support one or multiple (for example, three) cells.

The wireless network may be a heterogeneous network that includes BSs of different types, such as macro BSs, pico BSs, femto BSs, or relay BSs. These different types of BSs may have different transmit power levels, different coverage areas, and different impacts on interference in the wireless network. For example, macro BSs may have a high transmit power level (for example, 5 to 40 watts) whereas pico BSs, femto BSs, and relay BSs may have lower transmit power levels (for example, 0.1 to 2 watts). In the example shown in FIG. 1, a BS 110a may be a macro BS for a macro cell 102a, a BS 110b may be a pico BS for a pico cell 102b, and a BS 110c may be a femto BS for a femto cell 102c. A network controller 130 may couple to the set of BSs 110a and 110b, and may provide coordination and control for these BSs. Network controller 130 may communicate with the BSs via a backhaul. The BSs may also communicate with one another, for example, directly or indirectly via a wireless or wireline backhaul.

In some aspects, a cell may not be stationary, rather, the geographic area of the cell may move in accordance with the location of a mobile BS. In some aspects, the BSs may be interconnected to one another or to one or more other BSs or network nodes (not shown) in the wireless network through various types of backhaul interfaces, such as a direct physical connection or a virtual network, using any suitable transport network.

The wireless network may also include relay stations. A relay station is an entity that can receive a transmission of data from an upstream station (for example, a BS or a UE) and send a transmission of the data to a downstream station (for example, a UE or a BS). A relay station may also be a UE that can relay transmissions for other UEs. In the example shown in FIG. 1, a relay BS 110d may communicate with macro BS 110a and a UE 120d in order to facilitate communication between BS 110a and UE 120d. A relay BS may also be referred to as a relay station, a relay base station, or a relay, among other examples.

UEs 120 (for example, 120a, 120b, 120c) may be dispersed throughout the wireless network, and each UE may be stationary or mobile. A UE may also be referred to as an access terminal, a terminal, a mobile station, a subscriber unit, or a station, among other examples. A UE may be a cellular phone (for example, a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (for example, smart ring, smart bracelet)), an entertainment device (for example, a music or video device, or a satellite radio), a vehicular component or sensor, smart meters/sensors, industrial manufacturing equipment, a global positioning system device, or any other suitable device that is configured to communicate via a wireless medium.

Some UEs may be considered machine-type communication (MTC) or evolved or enhanced machine-type communication (eMTC) UEs. MTC and eMTC UEs include, for example, robots, drones, remote devices, sensors, meters, monitors or location tags, among other examples, that may communicate with a base station, another device (for example, remote device), or some other entity. A wireless node may provide, for example, connectivity for or to a network (for example, a wide area network such as Internet or a cellular network) via a wired or wireless communication link. Some UEs may be considered Internet-of-Things (IoT) devices, or may be implemented as NB-IoT (narrowband internet of things) devices. Some UEs may be considered a Customer Premises Equipment (CPE). UE 120 may be included inside a housing that houses components of UE 120, such as processor components or memory components, among other examples.

In general, any quantity of wireless networks may be deployed in a given geographic area. Each wireless network may support a particular radio access technology (RAT) and may operate on one or more frequencies or frequency channels. A frequency may also be referred to as a carrier among other examples. Each frequency may support a single RAT in a given geographic area in order to avoid interference between wireless networks of different RATs. In some cases, NR or 5G RAT networks may be deployed.

In some aspects, two or more UEs 120 (for example, shown as UE 120a and UE 120e) may communicate directly with one another using one or more sidelink channels (for example, without using a base station 110 as an intermediary). For example, the UEs 120 may communicate using peer-to-peer (P2P) communications, device-to-device (D2D) communications, a vehicle-to-everything (V2X) protocol (for example, which may include a vehicle-to-vehicle (V2V) protocol or a vehicle-to-infrastructure (V2I) protocol), a mesh network, or a combination thereof. In such examples, the UE 120 may perform scheduling operations, resource selection operations, or other operations described elsewhere herein as being performed by the base station 110.

Devices of the wireless network may communicate using the electromagnetic spectrum, which may be subdivided based on frequency or wavelength into various classes, bands, or channels. For example, devices of the wireless network may communicate using an operating band having a first frequency range (FR1), which may span from 410 MHz to 7.125 GHz. As another example, devices of the wireless network may communicate using an operating band having a second frequency range (FR2), which may span from 24.25 GHz to 52.6 GHz. The frequencies between FR1 and FR2 are sometimes referred to as mid-band frequencies. Although a portion of FR1 is greater than 6 GHz, FR1 is often referred to as a "sub-6 GHz" band. Similarly, FR2 is often referred to as a "millimeter wave" band despite being different from the extremely high frequency (EHF) band (30 GHz-300 GHz) which is identified by the International Telecommunications Union (ITU) as a "millimeter wave" band. Thus, unless specifically stated otherwise, it should be understood that the term "sub-6 GHz" may broadly represent frequencies less than 6 GHz, frequencies within FR1, mid-band frequencies (for example, greater than 7.125 GHz), or a combination thereof. Similarly, unless specifically stated otherwise, it should be understood that the term "millimeter wave" may broadly represent frequencies within the EHF band, frequencies within FR2, mid-band frequencies (for example, less than 24.25 GHz), or a combination thereof. The frequencies included in FR1 and FR2 may be modified, and techniques described herein are applicable to those modified frequency ranges.

Figure 2:
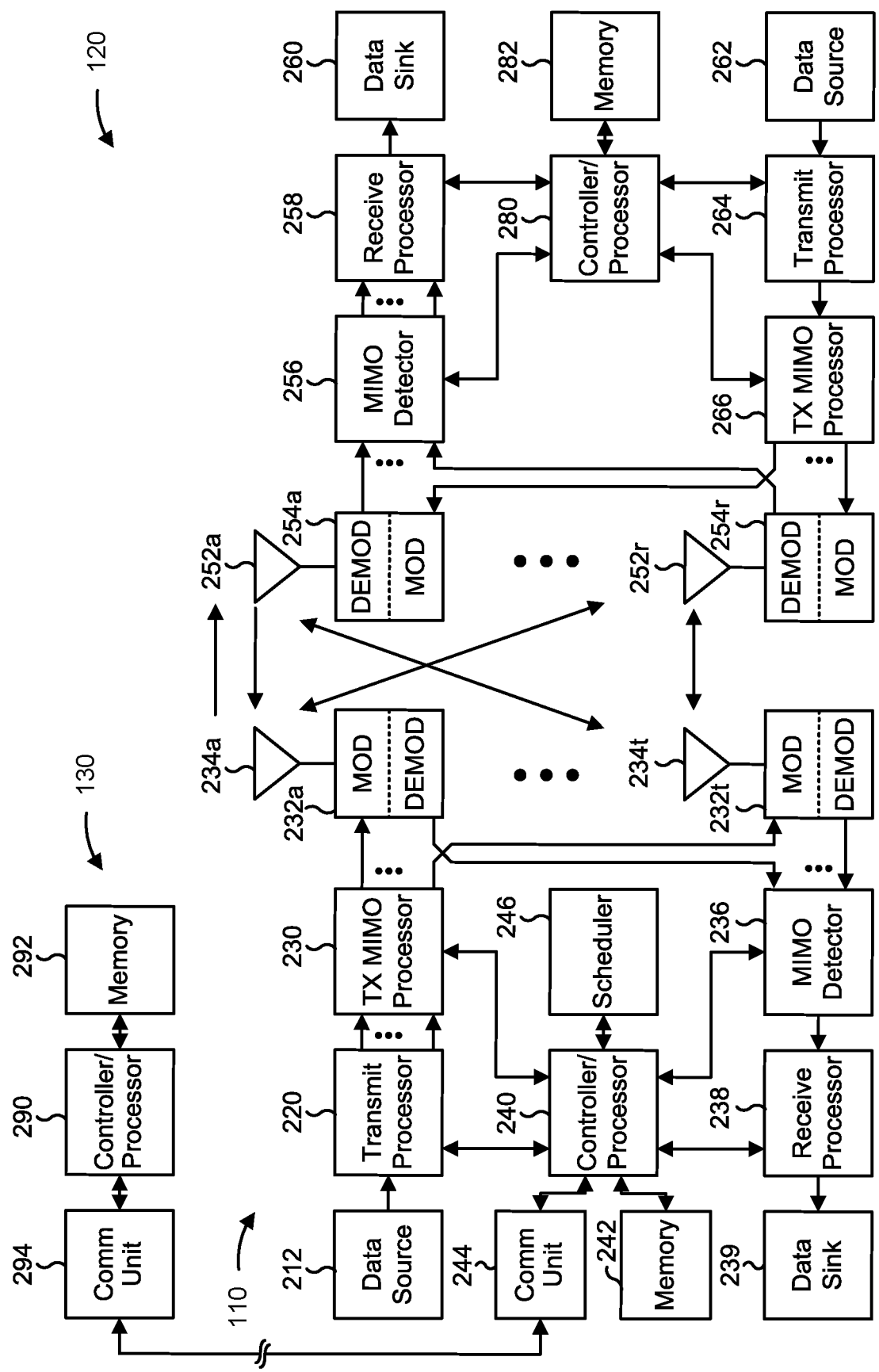
FIG. 2 is a diagram illustrating an example base station (BS) in communication with a user equipment (UE) in a wireless network in accordance with the present disclosure.

FIG. 2 is a diagram illustrating an example base station in communication with a UE in a wireless network in accordance with the present disclosure. The base station may correspond to base station 110 of FIG. 1. Similarly, the UE may correspond to UE 120 of FIG. 1.

Base station 110 may be equipped with T antennas 234a through 234t, and UE 120 may be equipped with R antennas 252a through 252r, where in general T≥1 and R≥1. At base station 110, a transmit processor 220 may receive data from a data source 212 for one or more UEs, select one or more modulation and coding schemes (MCSs) for each UE based at least in part on channel quality indicators (CQIs) received from the UE, process (for example, encode) the data for each UE based at least in part on the MCS(s) selected for the UE, and provide data symbols for all UEs. Transmit processor 220 may also process system information (for example, for semi-static resource partitioning information (SRPI) among other examples) and control information (for example, CQI requests, grants, or upper layer signaling) and provide overhead symbols and control symbols. Transmit processor 220 may also generate reference symbols for reference signals and synchronization signals. A transmit (TX) multiple-input multiple-output (MIMO) processor 230 may perform spatial processing (for example, precoding) on the data symbols, the control symbols, the overhead symbols, or the reference symbols, if applicable, and may provide T output symbol streams to T modulators (MODs) 232a through 232t. Each MOD 232 may process a respective output symbol stream (for example, for OFDM among other examples) to obtain an output sample stream. Each MOD 232 may further process (for example, convert to analog, amplify, filter, and upconvert) the output sample stream to obtain a downlink signal. T downlink signals from MODs 232a through 232t may be transmitted via T antennas 234a through 234t, respectively.

At UE 120, antennas 252a through 252r may receive the downlink signals from base station 110 or other base stations and may provide received signals to R demodulators (DEMODs) 254a through 254r, respectively. Each DEMOD 254 may condition (for example, filter, amplify, downconvert, and digitize) a received signal to obtain input samples. Each DEMOD 254 may further process the input samples (for example, for OFDM) to obtain received symbols. A MIMO detector 256 may obtain received symbols from all R DEMODs 254a through 254r, perform MIMO detection on the received symbols if applicable, and provide detected symbols. A receive processor 258 may process (for example, decode) the detected symbols, provide decoded data for UE 120 to a data sink 260, and provide decoded control information and system information to a controller/processor 280. The term "controller/processor" may refer to one or more controllers, one or more processors, or a combination of one or more controllers and one or more processors. A channel processor may determine one or more of a reference signal received power (RSRP) parameter, a received signal strength indicator (RSSI) parameter, a reference signal received quality (RSRQ) parameter, or a channel quality indicator (CQI) parameter, among other examples. In some aspects, one or more components of UE 120 may be included in a housing.

Network controller 130 may include communication unit 294, controller/processor 290, and memory 292. Network controller 130 may include, for example, one or more devices in a core network. Network controller 130 may communicate with base station 110 via communication unit 294.

Antennas (such as antennas 234a through 234t or antennas 252a through 252r) may include, or may be included within, one or more antenna panels, antenna groups, sets of antenna elements, or antenna arrays, among other examples. An antenna panel, an antenna group, a set of antenna elements, or an antenna array may include one or more antenna elements. An antenna panel, an antenna group, a set of antenna elements, or an antenna array may include a set of coplanar antenna elements or a set of non-coplanar antenna elements. An antenna panel, an antenna group, a set of antenna elements, or an antenna array may include antenna elements within a single housing or antenna elements within multiple housings. An antenna panel, an antenna group, a set of antenna elements, or an antenna array may include one or more antenna elements coupled to one or more transmission or reception components, such as one or more components of FIG. 2.

On the uplink, at UE 120, a transmit processor 264 may receive and process data from a data source 262 as well as control information (for example, for reports including RSRP, RSSI, RSRQ, or CQI) from controller/processor 280. Transmit processor 264 may also generate reference symbols for one or more reference signals. The symbols from transmit processor 264 may be precoded by a TX MIMO processor 266 if applicable, further processed by MODs 254a through 254r (for example, for discrete Fourier transform spread orthogonal frequency division multiplexing (DFT-s-OFDM) or orthogonal frequency division multiplexing (OFDM) with a cyclic prefix (CP) (CP-OFDM)), and transmitted to base station 110. In some aspects, a modulator and a demodulator (for example, MOD/DEMOD 254) of the UE 120 may be included in a modem of the UE 120. In some aspects, the UE 120 includes a transceiver. The transceiver may include any combination of antenna(s) 252, modulators 254, demodulators 254, MIMO detector 256, receive processor 258, transmit processor 264, or TX MIMO processor 266. The transceiver may be used by a processor (for example, controller/processor 280) and memory 282 to perform aspects of any of the methods described herein.

At base station 110, the uplink signals from UE 120 and other UEs may be received by antennas 234, processed by DEMODs 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Base station 110 may include a scheduler 246 to schedule UEs 120 for downlink and uplink communications. In some aspects, a modulator and a demodulator (for example, MOD/DEMOD 232) of the base station 110 may be included in a modem of the base station 110. In some aspects, the base station 110 includes a transceiver. The transceiver may include any combination of antenna(s) 234, modulators 232, demodulators 232, MIMO detector 236, receive processor 238, transmit processor 220, or TX MIMO processor 230. The transceiver may be used by a processor (for example, controller/processor 240) and memory 242 to perform aspects of any of the methods described herein.

Controller/processor 240 of base station 110, controller/processor 280 of UE 120, or any other component(s) of FIG. 2 may perform one or more techniques associated with interleaver design for multi-slot uplink shared channel transmission, as described in more detail elsewhere herein. For example, controller/processor 240 of base station 110, controller/processor 280 of UE 120, or any other component(s) of FIG. 2 may perform or direct operations of, for example, process 1000 of FIG. 10, process 1100 of FIG. 11, or other processes as described herein. Memories 242 and 282 may store data and program codes for base station 110 and UE 120, respectively. In some aspects, memory 242 or memory 282 may include a non-transitory computer-readable medium storing one or more instructions (for example, code or program code) for wireless communication. For example, the one or more instructions, when executed (for example, directly, or after compiling, converting, or interpreting) by one or more processors of the base station 110 or the UE 120, may cause the one or more processors, the UE 120, or the base station 110 to perform or direct operations of, for example, process 1000 of FIG. 10, process 1100 of FIG. 11, or other processes as described herein. In some aspects, executing instructions may include running the instructions, converting the instructions, compiling the instructions, or interpreting the instructions, among other examples.

In some aspects, the UE includes means for receiving an indication of one or more sets of contiguous time domain resources for a multi-slot transmission occasion that spans multiple slots; means for selecting, for a communication on the multi-slot transmission occasion, coded bits of a plurality of coded bits on one of: a per slot basis, for each of the multiple slots, or a per segment basis, for each of a plurality of segments, each segment including one of the one or more sets of contiguous time domain resources and spanning across at least two slots; means for interleaving the coded bits on one of a per slot basis or a per segment basis to form one or more interleaved encoded bit sequences of a codeblock; or means for transmitting the communication including the one or more interleaved encoded bit sequences. The means for the UE to perform operations described herein may include, for example, one or more of antenna 252, demodulator 254, MIMO detector 256, receive processor 258, transmit processor 264, TX MIMO processor 266, modulator 254, controller/processor 280, or memory 282.

In some aspects, the UE includes means for selecting a first subset of the plurality of coded bits for a first slot of the multi-slot transmission occasion; or means for selecting a second subset of the plurality of coded bits for a second slot of the multi-slot transmission occasion, wherein the first slot and the second slot are contiguous.

In some aspects, the UE includes means for selecting a first subset of a plurality of coded bits for a first segment of the multi-slot transmission occasion; or means for selecting a second subset of the plurality of coded bits for a second segment of the multi-slot transmission occasion, wherein the first segment and the second segment are associated with a single physical channel.

In some aspects, the base station includes means for transmitting an indication of one or more sets of contiguous time domain resources for a multi-slot transmission occasion that spans multiple slots; means for receiving, on the multi-slot transmission occasion, a communication including an interleaved encoded bit sequence of a codeblock; means for demapping the codeblock to obtain soft information for each of a plurality of transmitted bits; means for de-interleaving the soft information on one of the per slot basis or the per segment basis to obtain de-interleaved soft information; means for concatenating the de-interleaved soft information to obtain concatenated soft information; or means for decoding the concatenated soft information to infer one or more codeblocks of the communication. The means for the base station to perform operations described herein may include, for example, one or more of transmit processor 220, TX MIMO processor 230, modulator 232, antenna 234, demodulator 232, MIMO detector 236, receive processor 238, controller/processor 240, memory 242, or scheduler 246.

In some aspects, the base station includes means for de-interleaving a first subset of the soft information for a first slot of the multi-slot transmission occasion; or means for de-interleaving a second subset of the soft information for a second slot of the multi-slot transmission occasion, wherein the first slot and the second slot are contiguous.

In some aspects, the base station includes means for de-interleaving a first subset of the soft information for a first segment of the multi-slot transmission occasion; or means for de-interleaving a second subset of the soft information for a second segment of the multi-slot transmission occasion, wherein the first segment and the second segment are associated with a single physical channel.

Figure 3:
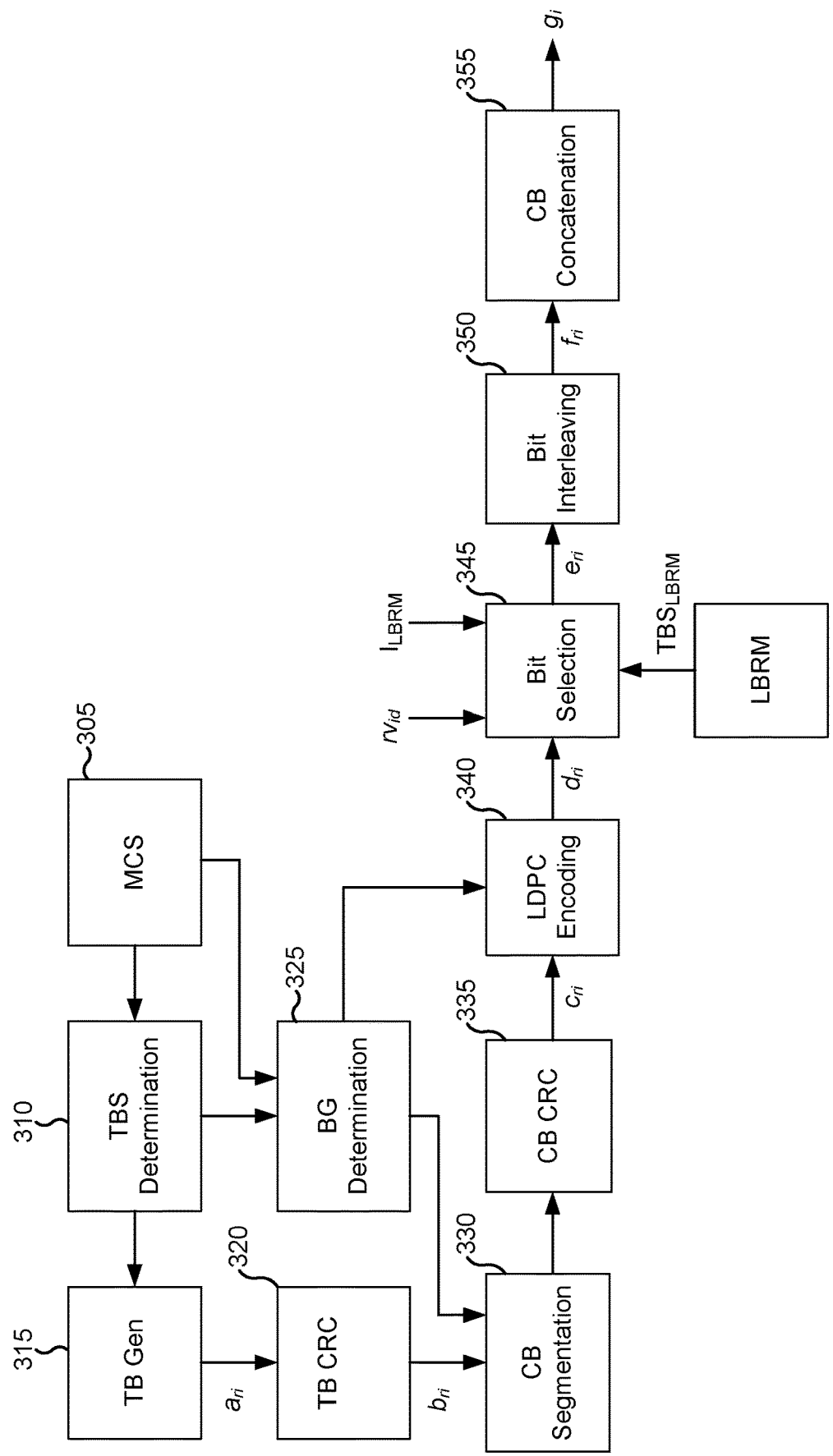
FIG. 3 is a diagram illustrating an example of an uplink transmission coding chain in accordance with the present disclosure.

FIG. 3 is a diagram illustrating an example of an uplink transmission coding chain in accordance with the present disclosure. The coding may be used for the transmission of data payloads in a wireless network, such as via a physical uplink shared channel (PUSCH) or a physical downlink shared channel (PDSCH). The operations of FIG. 3 may be performed by a transmitter, such as a UE (e.g., UE 120) or a base station (e.g., base station 110).

The coding chain may be based at least in part on a modulation and coding scheme (MCS), which is shown at 305. An MCS is an index indicating a modulation and a code rate for a communication. For example, an MCS may indicate how many bits can be transmitted per resource element. A modulation indicates a number of bits (whether parity bits or information bits) per resource element, and a code rate indicates a ratio between information bits and parity bits for encoding. Generally, the MCS is indicated via scheduling information for a given communication, such as in downlink control information (DCI).

At 310, the transmitter may determine a transport block size (TBS) based at least in part on the MCS. A TBS indicates how many bits are to be passed from the medium access control (MAC) layer to the physical layer in one instance of a uplink shared channel transmission that may span more than one slot. For example, the payload for the physical layer (such as in a PUSCH or a PDSCH) is a transport block. The transport block may include a number of bits, determined based at least in part on the MCS and a number of physical resource blocks (PRBs) to be used to transmit the transport block.

At 315, the transmitter may generate a transport block an. For example, the transport block may include a number of bits indicated by the TBS of the transport block. At 320, the UE may append a cyclic redundancy check (CRC) to the transport block to form a transport block bn. The CRC aids in error detection. The CRC may be generated using a cyclic generator polynomial and may be appended to an end of the transport block.

At 325, the transmitter may determine a base graph (BG) for the transport block. A BG is a parameter for determining parity bits for a transmission based at least in part on a TBS and a code rate (with BG1 being intended for transport blocks with a larger TBS, and BG2 being intended for transport blocks with a smaller TBS).

At 330, the transmitter may perform codeblock (CB) segmentation for the transport block bn. "CB segmentation" refers to segmentation of the TB to form one or more codeblocks for channel coding and rate matching. At 335, the transmitter may append one or more CRCs to the one or more codeblocks to form codeblocks $c_{ri}$. For example, the transmitter may perform per-codeblock CRC determination and insertion, which aids in early error detection.

At 340, the transmitter may perform low density parity check (LDPC) encoding on the one or more codeblocks to form encoded bits $d_{ri}$. More generally, the transmitter may perform channel coding according to one or more parameters such as the BG determined at 320. The LDPC encoding may generate a plurality of bits that are stored in a circular buffer, as described in connection with FIG. 4. In some aspects, the encoded bits may be referred to as an encoded codeblock. The encoded codeblock $d_{ri}$, is distinct from the codeblocks $c_{ri}$.

At 345, the transmitter may perform bit selection. "Bit selection" refers to selecting coded bits (sometimes referred to as encoded bits) $e_{ri}$ (where the totality of the selected coded bits are represented by E) for interleaving and concatenation. In some cases, "bit selection" is referred to as "rate matching." As shown, the bit selection may be based at least in part on a redundancy version index ($rv_{id}$), a limited buffer rate matching (LBRM) index ($I_{LBRM}$), and an LBRM transport block size ($TBS_{LBRM}$).

The transmitter may select a number of coded bits per codeblock. There can be one or multiple different values for the number of coded bits per codeblock. Codeblocks may be aligned to RE boundaries. G may represent the actual number of bits available for transmission. C' may represent the number of codeblocks to be transmitted, wherein C' is according to a codeblock group transmission information (CBGTI) field if the CBGTI field is present in DCI, or is C (that is, all codeblocks) if the CBGTI field is not present. Bits may be selected (e.g., read) sequentially from the circular buffer. A starting position for a codeblock, $k_0$, may be determined by the RV. The number of bits read is E, excluding filler bits.

At 350, the transmitter may perform interleaving to generate one or more interleaved encoded bit sequences $f_{ri}$. In some cases, "interleaving" is referred to as "channel interleaving." In some aspects, the transmitter may perform row-column interleaving. In row-column interleaving, selected bits are arranged into a number of rows corresponding to the modulation order. Then, selected bits are read column-by-column, such that bits from each row are interleaved with each other. For redundancy version 0, the interleaver may be a systematic-bit priority interleaver, so that systematic bits are placed in higher reliability positions in a quadrature amplitude modulation (QAM) symbol. When binary phase shift keying (BPSK) is used, the interleaver may not affect the bit stream. At 355, the transmitter may perform codeblock concatenation to generate a codeblock $g_i$.

After the codeblock has been generated, the transmitter may transmit the codeblock. For example, the transmitter may perform scrambling, modulation, layer mapping, antenna port mapping, mapping to one or more virtual resource blocks, and mapping from virtual resource blocks to physical resource blocks. Then, the transmitter may transmit a communication carrying an encoded transport block, which is based at least in part on the codeblock.

A receiver may receive the communication carrying the encoded transport block over the time-frequency resources assigned for this transmission. The receiver estimates the channel using the demodulation reference signals transmitted along with the encoded bits. Using the estimated channel and the received signal, the receiver performs the demapping operation on each resource element of the received signal to obtain soft information regarding the bit values of the encoded transport block. Soft information may take the form of a log-likelihood ratio (such as a probability, based on the received signal, that a transmitted bit is a 0 or a 1). This probability could be quantized to a few levels (for example, 16 or 32 levels). In the extreme case that the probability is quantized to 2 levels, the soft information degenerates to "hard" information. For example, a two-level quantization of the probability may represent the receiver's best estimation as to what the transmitted bit was, with no further nuance on this guess.

The receiver may perform de-interleaving on the soft information to obtain de-interleaved soft information. The receiver may concatenate the de-interleaved soft information to obtain concatenated soft information. The receiver may decode the concatenated soft information to infer one or more codeblocks of the communication.

Figure 4:
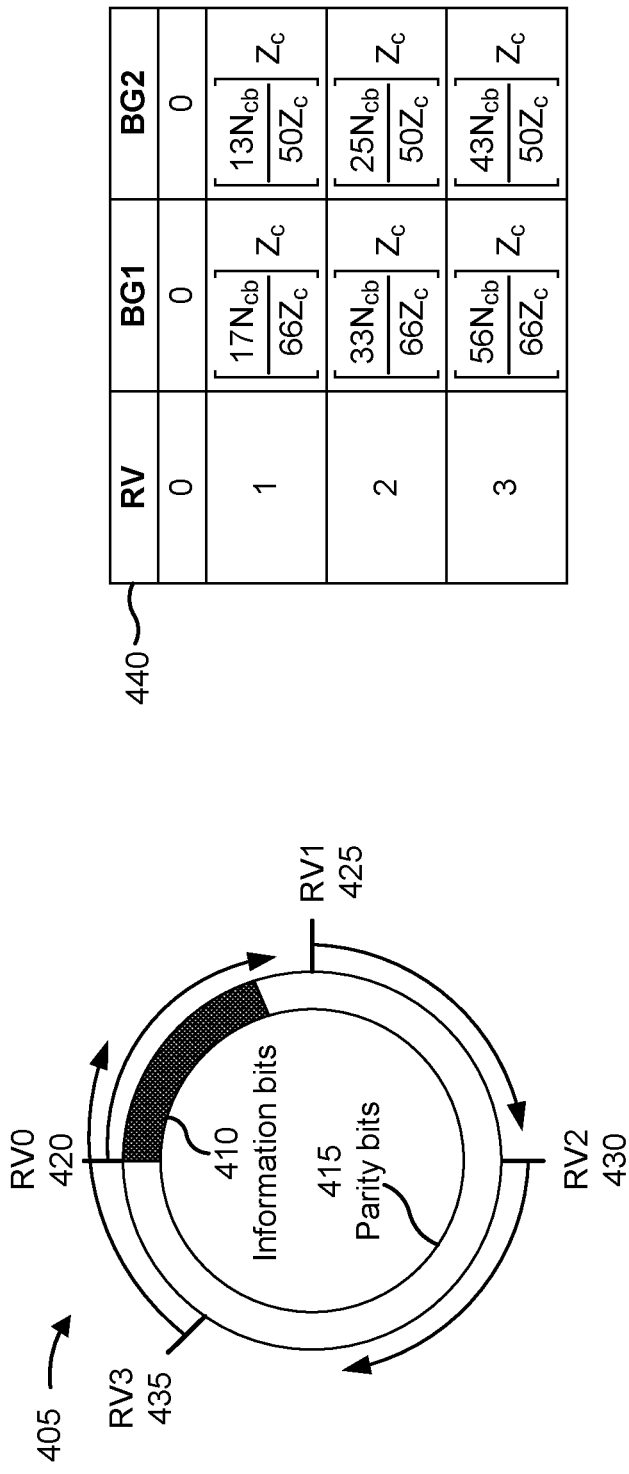
FIG. 4 is a diagram illustrating an example of redundancy version cycling based on uplink transmission occasions in accordance with the present disclosure.

FIG. 4 is a diagram illustrating an example of redundancy version cycling based on uplink transmission occasions, in accordance with the present disclosure. A UE (such as UE 120) may apply redundancy version cycling to PUSCH repetitions to transmit different redundancy versions of the PUSCH repetition in different transmission occasions (or in different slots or different segments of a transmission occasion).

A "redundancy version" (RV) of a PUSCH repetition may be used to select a set of encoded bits that are transmitted for that PUSCH repetition. The RV may indicate a starting location in a circular buffer such as circular buffer 405. Using RV cycling, the UE transmits a different set of encoded bits in different PUSCH repetitions. For example, the UE may store bits for an uplink transmission in a circular buffer 405 (stored in memory of the UE). The circular buffer 405 stores information bits 410 (sometimes called systematic bits) and parity bits 415 (sometimes called parity-check bits). The information bits 410 may include the data to be transmitted, and the parity bits 415 may include linear combinations of the data (that is, of the information bits 410). The UE may encode information bits 410, parity bits 415, or a combination of information bits 410 and parity bits 415 into a set of encoded bits and may transmit the set of encoded bits. The particular bits that are selected to be included in the set of encoded bits for a PUSCH repetition depend on (or are defined by) the RV of that PUSCH repetition. By selecting different combinations of information bits 410 and parity bits 415, the UE improves reliability of PUSCH transmission, since not all bit positions are associated with the same level of reliability.

As an example, the starting bit locations may be defined by a table 440, such as for NR hybrid automatic repeat request (HARD) using low-density parity-check (LDPC) code. The table 440 defines starting bit locations in the circular buffer 405 for a first base graph (BG1) and a second base graph (BG2). A base graph is a parameter for determining parity bits 415 for a transmission based at least in part on a transport block (TB) size and a code rate (with BG1 being intended for TBs with a larger TB size, and BG2 being intended for TBs with a smaller TB size). Referring to the table, Nib represents the length of the circular buffer 405 (e.g., the number of bits included in the circular buffer 405), and $Z_c$ represents a lifting size, which is based at least in part on the number of information bits 410 and the number of BG columns corresponding to information bits 410. The table 440 is just one example, and other starting bit locations may be used in practice.

In some examples, a base station (e.g., base station 110) may transmit information, such as an RV index, to the UE. For example, the base station may transmit the RV index for a PUSCH communication in downlink control information (DCI) that schedules the PUSCH communication. The RV index may indicate a sequence of RVs to be applied to a corresponding sequence of occasions, such as a sequence of PUSCH transmission occasions, a sequence of slots, or a sequence of segments. The UE may increment a counter n (sometimes called an index n) for each occasion following (or indicated by) the DCI. The UE may use the information transmitted by the base station (the RV index) and the value of the counter n for a particular occasion to determine an RV to be applied to that occasion.

For example, as shown by table 445, for PUSCH Repetition Type A, if the base station indicates an RV index of 0, then the UE may determine an RV to be applied to an nth transmission occasion (for PUSCH Repetition Type A) by calculating n mod 4, where "mod" represents a modulo operation. If n mod 4=0 (for transmission occasion 0), then the UE applies RV0 to that transmission occasion. If n mod 4=1 (for transmission occasion 1), then the UE applies RV2 to that transmission occasion. If n mod 4=2 (for transmission occasion 2), then the UE applies RV3 to that transmission occasion. If n mod 4=3 (for transmission occasion 3), then the UE applies RV1 to that transmission occasion. As shown, the RV index may have a value of 0, 1, 2, or 3, each of which corresponds to a different sequence of RVs (e.g., a different order for RV0, RV1, RV2, and RV3).

Similarly, for PUSCH Repetition Type B, if the base station indicates an RV index of 0, then the UE 120 may determine an RV to be applied to an nth actual repetition (of PUSCH Repetition Type B) by calculating n mod 4. If n mod 4=0 (for actual repetition 0), then the UE applies RV0 to that actual repetition. If n mod 4=1 (for actual repetition 1), then the UE applies RV2 to that actual repetition. If n mod 4=2 (for actual repetition 2), then the UE applies RV3 to that actual repetition. If n mod 4=3 (e.g., for actual repetition 3), then the UE applies RV1 to that actual repetition.

Some techniques described herein use multi-slot transmission occasions, such as multi-slot PUSCH occasions. In such examples, RVs may be assigned per PUSCH (such that a PUSCH occupying a plurality of contiguous slots on a multi-slot transmission occasion has a given RV), or per segment (such that a segment associated with a PUSCH, occupying multiple sets of contiguous slots, is associated with a given RV). In such a case, RV indexes may be incremented according to how RVs are assigned (that is, per PUSCH, per segment, or per slot, such as for each slot of a multi-slot transmission). Multi-slot transmission occasions are described in more detail below. A multi-slot transmission is a communication where a payload (such as a transport block) is transmitted across multiple slots (such as with repetitions of the transport block in each slot or with a first part of the transport block in a first slot and a second part of the transport block in a second slot).

Figure 5:
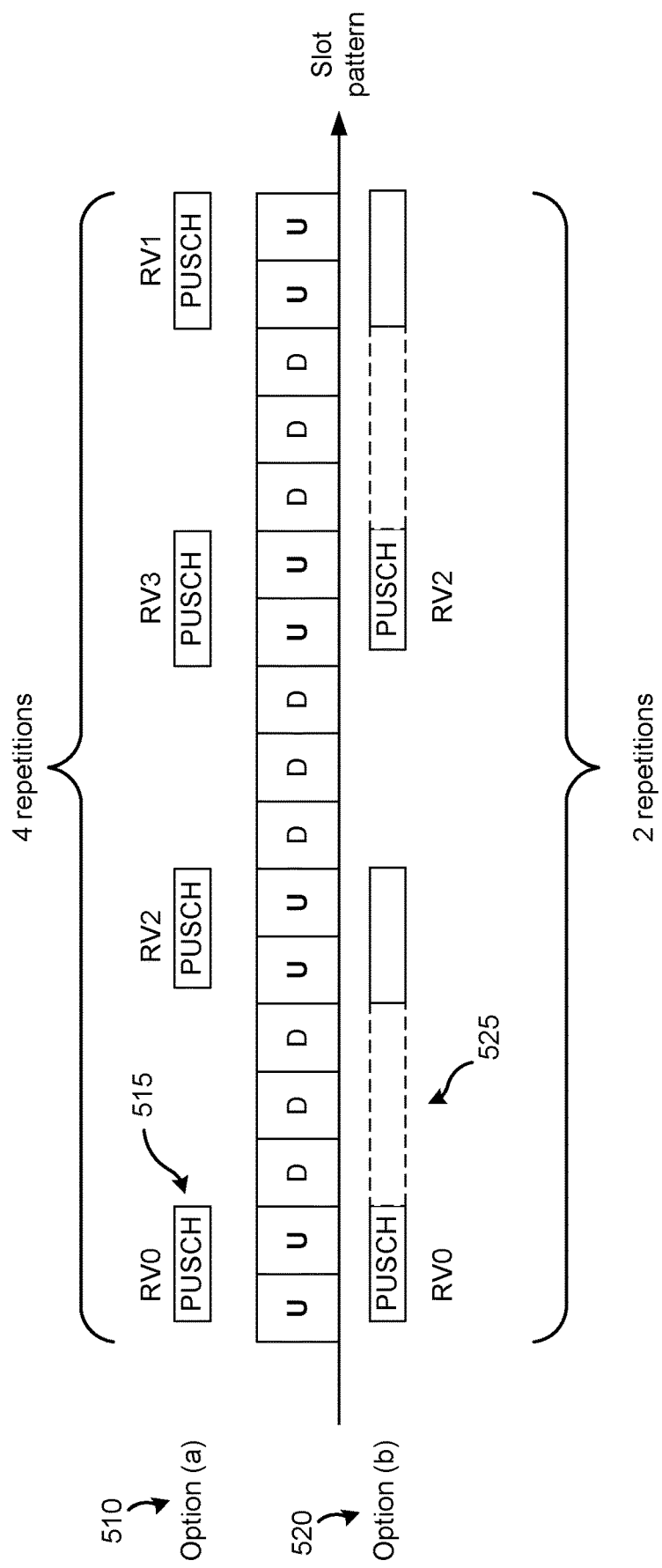
FIG. 5 is a diagram illustrating an example of multi-slot uplink shared channel transmission in accordance with the present disclosure.

FIG. 5 is a diagram illustrating an example of multi-slot uplink shared channel transmission in accordance with the present disclosure. Slots are labeled as "U," indicating an uplink slot (that is, a slot with a threshold number of configured or indicated uplink symbols), or "D," indicating a downlink slot (that is, a slot with a threshold number of configured or indicated downlink symbols). Two options are depicted for a UE to transmit PUSCH repetitions over a set of contiguous time domain resources, where the PUSCH repetitions span multiple slots and/or multiple segments, as described in further detail herein. PUSCH repetitions that span multiple slots or multiple segments may be referred to herein as multi-slot PUSCH transmissions (MSPTs). Although techniques are described herein in connection with PUSCH repetitions and MSPTs, these techniques can be applied to various types of uplink repetitions, such as an uplink data repetition, an uplink control repetition (such as physical uplink control channel (PUCCH) repetition), or the like.

A repetition, such as an uplink repetition or a downlink repetition, may be used to improve reliability, such as for ultra reliable low latency communication (URLLC) or for UEs located in a geographic area with poor channel conditions (such as a cell edge). When repetitions are used, a transmitter repeats transmission of a communication multiple times. For example, a UE may transmit an initial uplink communication and may repeat transmission of (that is, may retransmit) that uplink communication one or more times. Each repetition may include different encoded bits in accordance with different RVs, as described herein. Therefore, a receiver can attempt to combine multiple repetitions to improve the likelihood of successfully decoding a payload of the multiple repetitions.

As used herein, the term "repetition" is used to refer to the initial communication and is also used to refer to a repeated transmission of the initial communication. For example, if a UE is configured to transmit four repetitions, then the UE may transmit an initial transmission and may transmit three repeated transmissions of that initial transmission. Thus, each transmission (regardless of whether the transmission is an initial transmission or a retransmission) is counted as a repetition. A repetition may be transmitted in a transmission occasion, which is sometimes referred to as a transmission instance. In these examples, a transmission occasion is a multi-slot transmission occasion, which facilitates the transmission of MSPTs.

For a first type of MSPT, shown at 510 and referred to as Option (a), each repetition and each multi-slot transmission occasion spans a set of contiguous resources (such as symbols or slots). Option (a) may enable, for example, a UE to transmit a transport block, spanning a set of contiguous slots, in a single transmission occasion. For example, for a first MSPT 515 that includes a codeblock associated with RV0, the repetition is shown spanning a set of two contiguous slots. As used herein "spanning across a set of contiguous slots" means "including at least one symbol of each slot of the set of contiguous slots."

For a second type of MSPT, shown at 520 and referred to as Option (b), each repetition spans two or more segments, and a segment includes a set of contiguous slots. Option (b) may enable, for example, a UE to transmit a transport block, spanning multiple sets of contiguous slots, in a single transmission occasion. For example, for a second MSPT 525 that includes a codeblock associated with RV0, the repetition is shown spanning two sets of contiguous slots. Thus, the repetition is transmitted on two segments of the transmission occasion, where a first segment occupies at least part of the first and second slots of the slot pattern, and a second segment occupies at least part of the sixth and seventh slots of the slot pattern.

In some aspects, RV cycling may be performed on a per slot basis. For example, each slot of a multi slot transmission occasion may be assigned a respective RV index. In some aspects, RV cycling may be performed on a per transmission occasion basis. For example, each transmission occasion may be assigned a respective RV index. In some aspects, RV cycling may be performed on a per segment basis. For example, each segment of a transmission occasion may be assigned a respective RV index.

Figure 6:
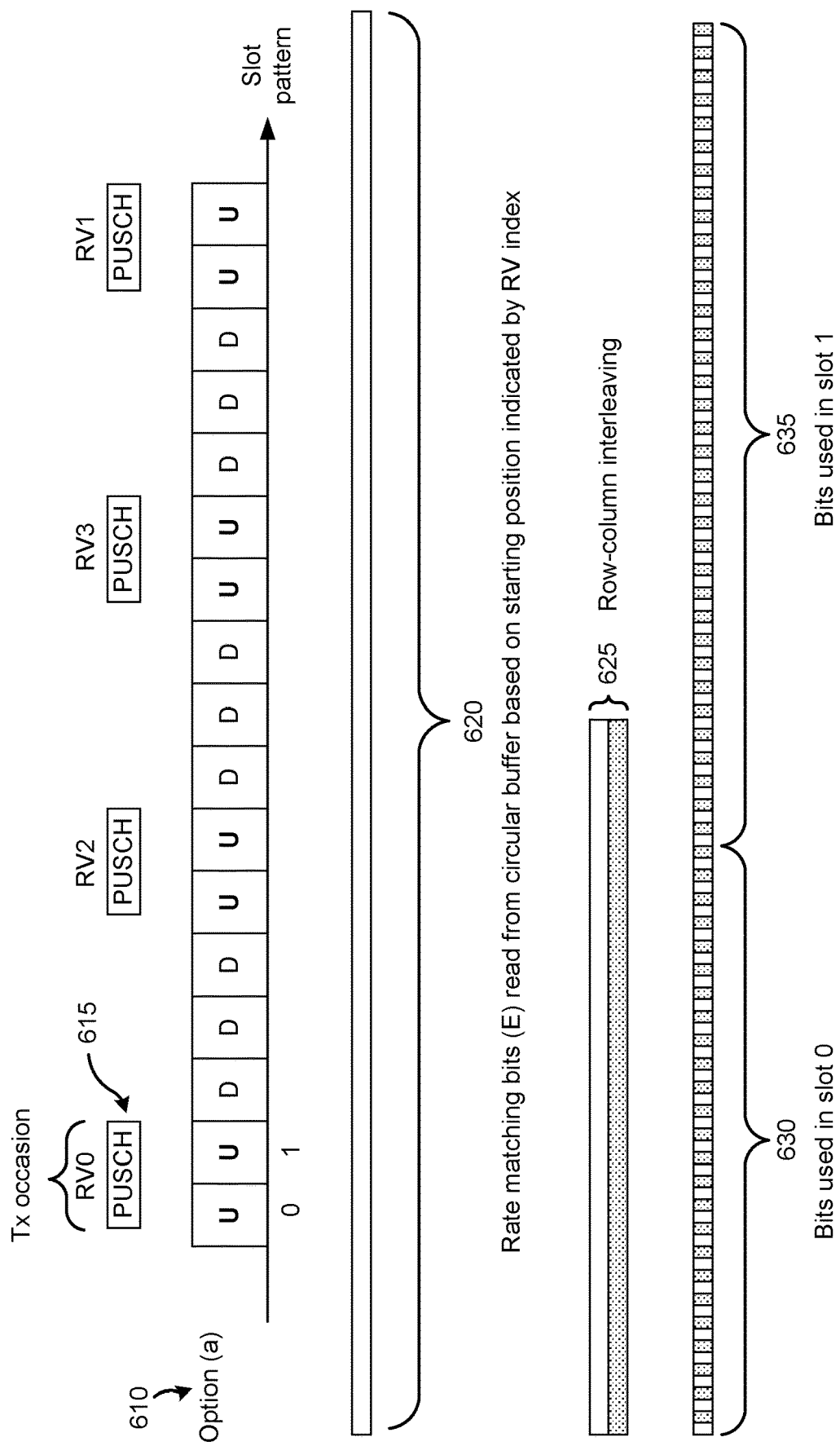
FIG. 6 is a diagram illustrating an example of a per transmission occasion interleaver design for multi-slot uplink shared channel transmission in accordance with the present disclosure.

FIG. 6 is a diagram illustrating an example of a per transmission occasion interleaver design for multi-slot uplink shared channel transmission in accordance with the present disclosure. A UE may interleave a codeblock of bits for transmission to another device, such as a base station. The interleaver process is designed to improve transmission performance, for example, by distributing transmitted bits over time to achieve a desirable bit error distribution. For example, a set of bits are mapped to a modulation symbol. Not all bits mapped to a modulation symbol are carried with equal reliability. An interleaver uses the differences between reliability of bits mapped to a modulation symbol, and places information bits such that the bits occupy locations that enjoy higher reliability before being mapped to modulation symbols.

As shown by reference number 610, a UE may use the first type of MSPT, referred to as Option (a), to transmit encoded bits of a PUSCH that spans multiple slots. In this example, a first MSPT occasion 615 (also referred to as a multi-slot transmission occasion) spans a set of two contiguous slots (slot 0 and slot 1) and includes bits that correspond to RV0. The UE may obtain a codeblock 620 for the first MSPT occasion 615 from a circular buffer based at least in part on a starting position indicated by the RV index of RV0. For example, the UE may select rate matching bits (represented by E) from the circular buffer to obtain the codeblock 620. As shown by reference number 625, the UE may perform interleaving on the codeblock to form a plurality of interleaved encoded bit sequences having data re-arranged via one or more interleaving processes described herein, such as row-column interleaving. As shown, interleaving the codeblock distributes the bits of the codeblock across the two slots of the MSPT occasion, resulting in a first subset 630 of the plurality of coded bits being transmitted via a first slot (slot 0) of the MSPT occasion and a second subset 635 of the plurality of coded bits being transmitted via a second slot (slot 1) of the MSPT occasion 615. After interleaving, the UE may transmit the coded bits via the MSPT occasion 615. For example, the UE may concatenate the coded and interleaved bits across all the codeblocks and transmit the entire encoded transport block.

In some aspects, interleaving may be performed on a per transmission occasion basis (as in FIG. 6) and RV cycling may be performed on a per slot basis. In other aspects, interleaving may be performed on a per transmission occasion basis and RV cycling may be performed on a per transmission occasion basis. In other aspects, interleaving may be performed on a per transmission occasion basis and RV cycling may be performed on a per segment basis.

The interleaving process improves transmission performance. However, when a PUSCH or other transmission spans multiple slots, a UE may need to store the state of the transmission across slots. In addition, the UE may need to store information indicating how much of an interleaved sequence was transmitted while also saving the non-transmitted sequence. This increases the complexity involved and the resources used by the UE when interleaving and transmitting a PUSCH over multiple slots, which may lead to the UE inefficiently consuming power, communication, network, and computing resources to interleave multi slot transmissions, and which may make UCI multiplexing inefficient or infeasible.

Various aspects relate generally to codeblock interleaving for multi-slot uplink shared channel transmissions on a per slot or per segment basis. Some aspects more specifically relate to selecting, for a codeblock of a PUSCH transmission communication that spans across multiple slots, coded bits on a per slot or per segment basis, and interleaving the coded bits on the per slot of per segment basis. In some aspects, for PUSCH transmission occasions that span multiple slots, a UE may interleave bits of the PUSCH for each of the multiple slots. In some aspects, for PUSCH transmission occasions that span multiple segments, each including multiple slots, a UE may interleave bits of the PUSCH for each segment.

Particular aspects of the subject matter described in this disclosure can be implemented to realize one or more of the following potential advantages. In some examples, the described techniques can be used to improve the quality and performance of network transmissions, such as PUSCH or other transmissions that span multiple slots. In addition, the use of codeblock interleaving for multi-slot uplink shared channel transmissions on a per slot or per segment basis may reduce the complexity of current UE interleaving processes and provides efficiency improvements for a UE, which may enable the UE to more efficiently consume power, communication, network, and computing resources, and to perform UCI multiplexing while reducing the latencies involved in the decision making process related to UCI multiplexing.

Figure 7:
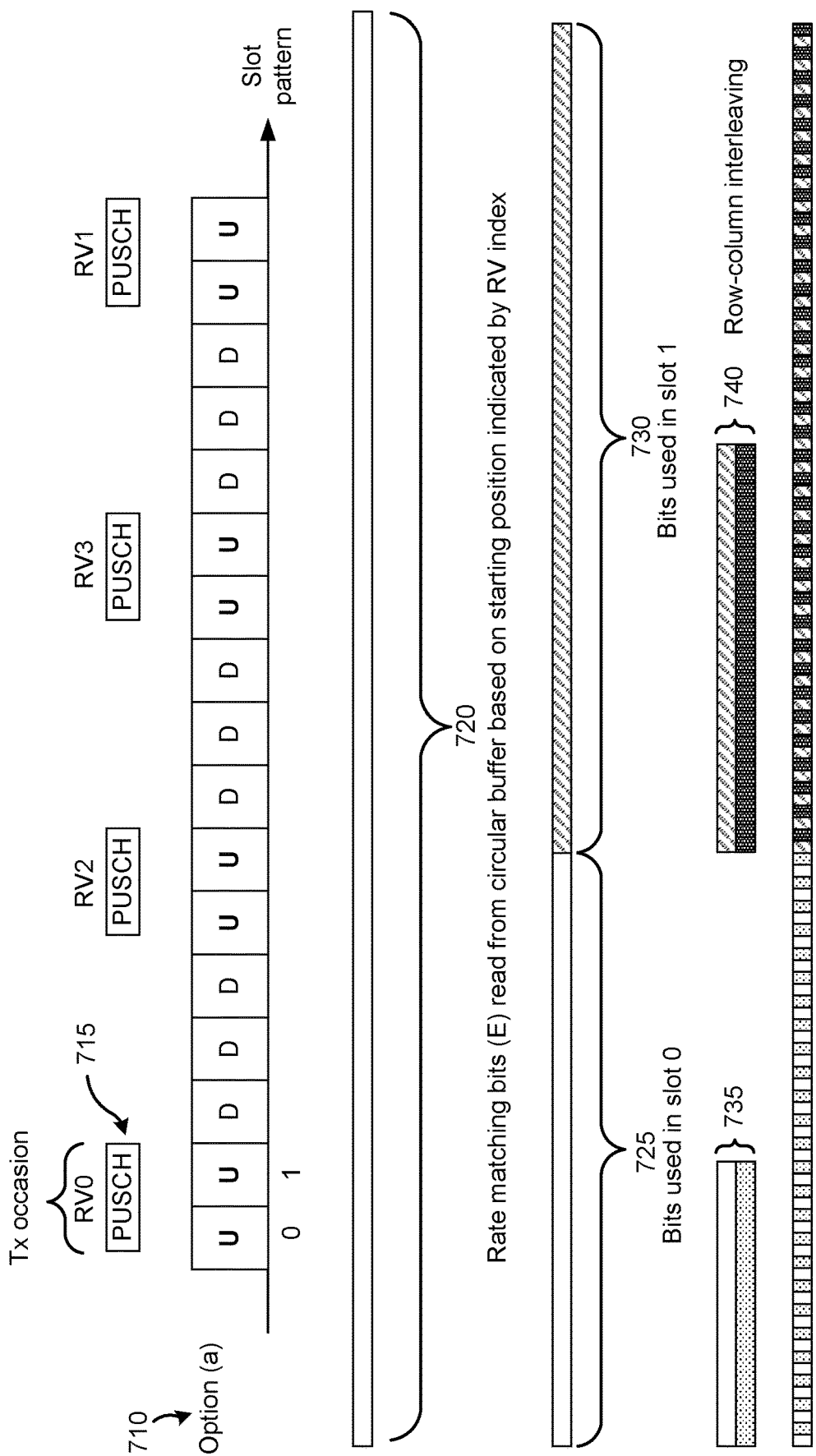
FIG. 7 is a diagram illustrating an example of a per slot interleaver design for multi-slot uplink shared channel transmission in accordance with the present disclosure.

FIG. 7 is a diagram illustrating an example of a per slot interleaver design for multi-slot uplink shared channel transmission in accordance with the present disclosure.

A UE may use the first type of MSPT, Option (a) (indicated by 710), to transmit encoded bits of a PUSCH that spans multiple slots, including slot 0 and slot 1. In this example, a first MSPT occasion 715 spans a set of two contiguous slots and includes bits that correspond to RV0. the UE may obtain a codeblock 720 for the first MSPT occasion 715 from a circular buffer based at least in part on a starting position indicated by the RV index. As shown, the UE may select a portion of the codeblock to be used for each slot of the MSPT occasion on a per slot basis, selecting a first subset 725 of the selected bits for transmission via a first slot (slot 0) of the MSPT occasion and a second subset 730 of the selected bits for transmission via a second slot (slot 1) of the MSPT occasion 715.

As shown, the UE may perform interleaving on each portion of the codeblock to form two sequences of interleaved encoded bits 735 and 740 having data re-arranged via one or more interleaving processes described herein. As shown, interleaving subsets of the codeblock 720 distributes the bits of the original codeblock across the two slots of the MSPT occasion, with each slot being associated with data interleaved via separate interleaving processes. After interleaving, the UE may transmit the encoded bits via the MSPT occasion. For example, the UE may concatenate the coded and interleaved bits to form a codeblock and may transmit the codeblock.

In some aspects, interleaving may be performed on a per slot basis (as in FIG. 7) and RV cycling may be performed on a per slot basis. In other aspects, interleaving may be performed on a per slot basis and RV cycling may be performed on a per transmission occasion basis. In yet other aspects, interleaving may be performed on a per slot basis and RV cycling may be performed on a per segment basis.

Particular aspects of the subject matter described in this disclosure can be implemented to realize one or more of the following potential advantages. In some examples, the described techniques can be used to improve the quality and performance of network transmissions, such as PUSCH or other transmissions that span multiple slots. When selecting bits and performing interleaving on a per slot basis, a UE may incur reduced overhead in that only a starting position within a circular buffer is stored for each slot, reducing the need to store additional information regarding the state of a transmission. In addition, there may be no need to buffer bits to be transmitted, as preserving the circular buffer suffices to referencing rate matched bits. Selecting bits and performing interleaving on a per slot basis also enables uplink control information (UCI) multiplexing to be performed on a per slot basis. In this way, the use of codeblock interleaving for multi-slot uplink shared channel transmissions on a per slot basis may reduce the complexity of current UE interleaving processes and provides efficiency improvements for a UE, which may enable the UE to more efficiently consume power, communication, network, and computing resources.

Figure 8:
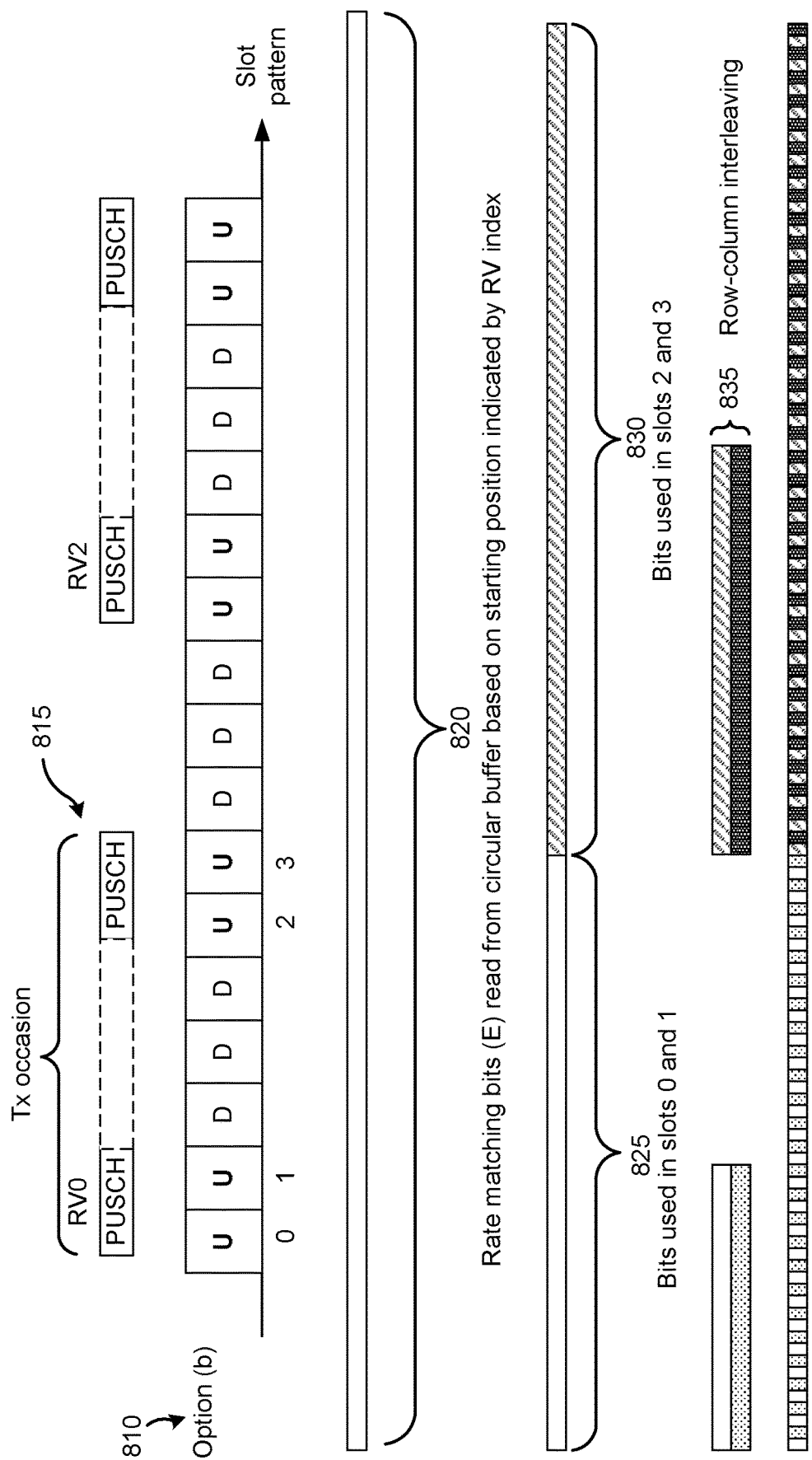
FIG. 8 is a diagram illustrating an example of a per segment interleaver design for multi-slot uplink shared channel transmission in accordance with the present disclosure.

FIG. 8 is a diagram illustrating an example of a per segment interleaver design for multi-slot uplink shared channel transmission in accordance with the present disclosure.

A UE may use the second type of MSPT, Option (b) (indicated at 810), to transmit encoded bits of a PUSCH that spans multiple segments, or sets, of multiple contiguous slots. In this example, a first MSPT occasion 815 spans two segments, each segment corresponding to two contiguous slots. Further, the first MSPT occasion 815 includes bits that correspond to RV0. As shown, the UE may obtain a codeblock 820 (composed of rate matching bits represented by E) for the first MSPT occasion 815 from a circular buffer based on a starting position indicated by the RV index. As shown, the UE may select a portion of the codeblock 820 to be used for each segment of the MSPT occasion on a per segment basis, selecting a first subset 825 of the bits (bits for slots 0 and 1) for transmission via a first segment of the MSPT occasion, and a second subset 830 of the bits (bits for slots 2 and 3) for transmission via a second segment of the MSPT occasion.

As shown by reference number 835, the UE may perform interleaving on each portion of the codeblock to form two sequences of interleaved bits having data re-arranged via one or more interleaving processes described herein. As shown, interleaving portions of the codeblock distributes the bits of the original codeblock across the two segments of the MSPT occasion, with each segment being associated with data interleaved via separate interleaving processes. After interleaving, the UE may transmit the encoded bits via the MSPT occasion, which includes both segments.

In some aspects, interleaving may be performed on a per segment basis (as in FIG. 8), and RV cycling may be performed on a per segment basis. In other aspects, interleaving may be performed on a per segment basis and RV cycling may be performed on a per transmission occasion basis.

In some aspects, the UE may determine whether to perform interleaving. For example, the UE may determine whether to perform interleaving based at least in part on a condition at the UE or based at least in part on an indication from the base station. In some aspects, the determination of whether to perform interleaving (whether determined by the UE or signaled by the base station) may be based at least in part on a modulation and coding scheme (MCS) of the communication. For example, if the MCS satisfies a threshold, then the UE may perform interleaving, and if the MCS fails to satisfy the threshold, then the UE may not perform interleaving. In some aspects, the threshold may be an MCS associated with 16 quadrature amplitude modulation (16QAM). For example, the UE may not perform interleaving for communications associated with binary phase shift keying (BPSK) or quadrature phase shift keying (QPSK), and may perform interleaving for communications of 16QAM or above. This may be beneficial because interleaving can generally be deactivated for lower modulation schemes without significant detrimental impact, which conserves resources of the UE associated with interleaving and the base station associated with de-interleaving.

Particular aspects of the subject matter described in this disclosure can be implemented to realize one or more of the following potential advantages. In some examples, the described techniques can be used to improve the quality and performance of network transmissions, such as PUSCH or other transmissions that span multiple slots. When selecting bits and performing interleaving on a per segment basis, the UE may incur reduced overhead in that only a starting position within a circular buffer is stored for each slot, reducing the need to store additional information regarding the state of a transmission. In addition, there may be no need to buffer bits to be transmitted, as preserving the circular buffer suffices to referencing rate matched bits. In this way, the use of codeblock interleaving for multi-slot uplink shared channel transmissions on a per slot or per segment basis may reduce the complexity of current UE interleaving processes and provides efficiency improvements for a UE, which may enable the UE to more efficiently consume power, communication, network, and computing resources.

While the interleaving techniques described in connection with FIGS. 6, 7, and 8 are primarily described in the context of uplink communications, these techniques can also be applied for downlink communications.

Figure 9:
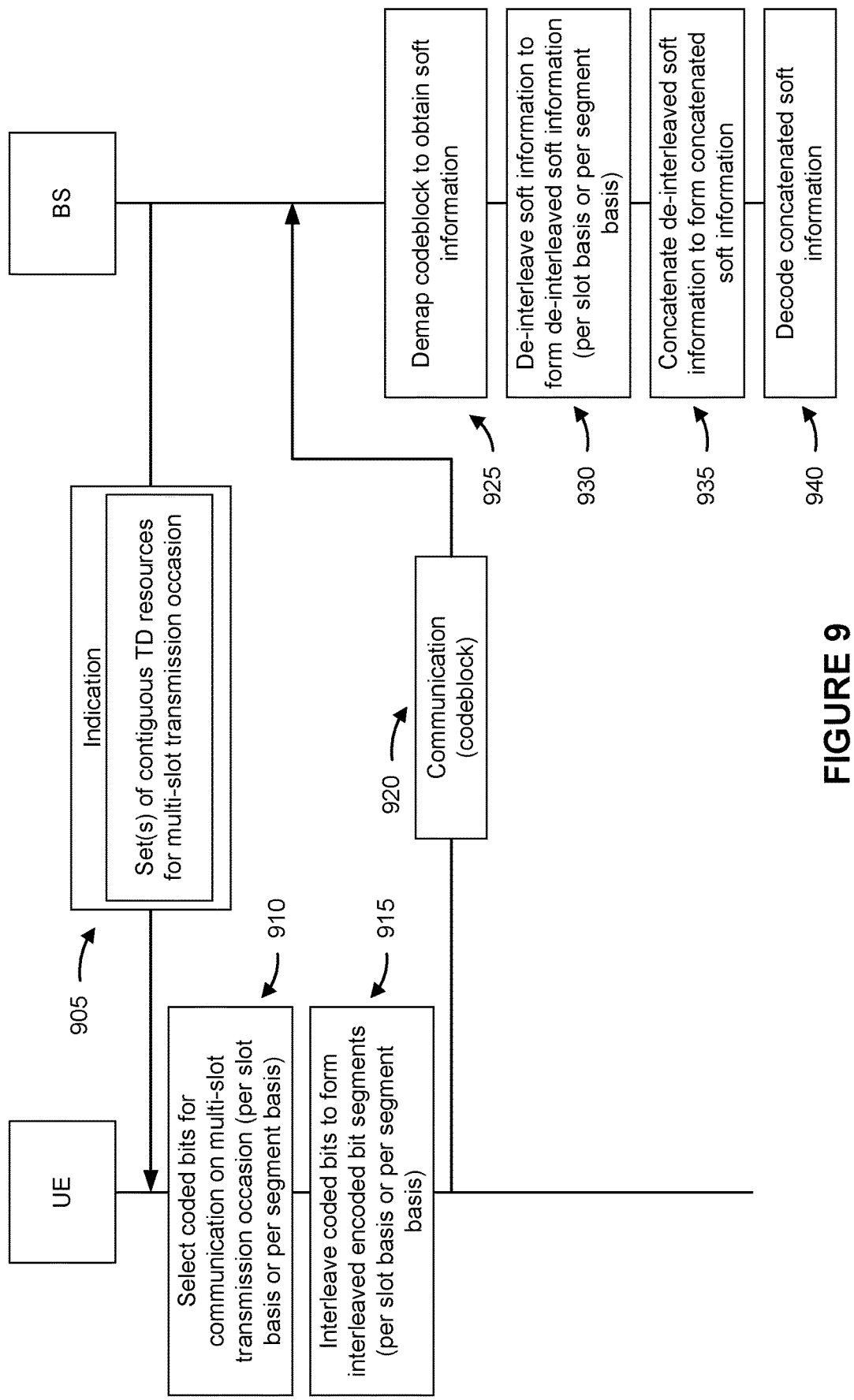
FIG. 9 is a diagram illustrating an example of signaling associated with multi-slot uplink shared channel transmission in accordance with the present disclosure.

FIG. 9 is a diagram illustrating an example of signaling associated with multi-slot uplink shared channel transmission in accordance with the present disclosure. As shown in FIG. 9, a UE (e.g., UE 120) may communicate (e.g., transmit an uplink transmission and/or receive a downlink transmission) with a base station (e.g., base station 110). In some aspects, the UE may communicate with another UE via one or more sidelink communications (e.g., in addition to, or in place of, communicating with the base station). The UE and the base station may be part of a wireless network (e.g., as shown in FIG. 1).

In a first operation 905, the base station may transmit, and the UE may receive, an indication of one or more sets of contiguous time domain resources for a multi-slot transmission (MST) occasion that spans multiple slots. In some aspects, the UE may receive the indication from another device (e.g., from another base station or another UE). In some aspects, the indication may indicate that the base station is capable of receiving codeblocks transmitted using one or more types of bit selection and interleaving processes described herein. The indication may be provided via radio resource control (RRC) signaling, medium access control (MAC) signaling, downlink control information (DCI), a combination thereof, or the like. In some aspects, the indication may include configuration information for the MST occasion. Additionally or alternatively, the indication may include scheduling information for a transmission on the MST occasion.

In some aspects, the one or more sets of contiguous time domain resources for the MST occasion may include (such as consist of) a single set of contiguous time domain resources that span multiple slots, the multiple slots being contiguous with one another (as in option (a) described above with reference to FIGS. 5, 6, and 7). In other aspects, the one or more sets of contiguous time domain resources for the MST occasion may include multiple sets of contiguous time domain resources. In such examples, each set of contiguous time domain resources may span two or more contiguous slots, and different sets of contiguous time domain resources are not contiguous with one another. In addition, each set of contiguous time domain resources, of the multiple sets of contiguous time domain resources, may be associated with a corresponding segment (as in option (b) described above with reference to FIGS. 5 and 8).

In a second operation 910, the UE may select coded bits for communication on an MST occasion on a per slot basis or per segment basis. For example, in some aspects, the UE may select, for a communication on an MST occasion, coded bits of multiple coded bits, on a per slot basis for each of multiple slots, or a per segment basis for each of multiple segments, where each segment spans multiple slots and includes one of the sets of contiguous time domain resources. In some aspects, the selected bits may be interleaved to form a codeblock (such as one or more codeblocks), as described below.

In some aspects, when selecting the coded bits on the per slot basis, the UE may select a first subset of the multiple bits for a first slot of the MST occasion and select a second subset of the multiple bits for a second slot of the MST occasion. In such examples, the first slot and the second slot may be contiguous.

In some aspects, when selecting the coded bits on the per segment basis, the UE may select a first subset of the multiple bits for a first segment of the MST occasion and select a second subset of the multiple bits for a second segment of the multi-slot transmission occasion. In such examples, the first and second segments may be associated with a single physical channel.

In some aspects, the communication is a PUSCH transmission that includes a single transport block, and the multi-slot transmission occasion is an MSPT. In some aspects, the codeblock may be one of multiple codeblocks of the communication. In such examples, selecting the coded bits on the per slot basis or the per segment basis may be based at least in part on the codeblock spanning across two slots or two segments. For example, the UE may not need to select coded bits on the per slot or per segment basis in a situation where the codeblock would not span multiple slots or segments.

In a third operation 915, the UE may interleave the coded bits, on a per slot basis or a per segment basis, to form one or more interleaved encoded bit sequences. For example, when interleaving on a per slot basis over multiple contiguous slots, the UE may perform a separate interleaver process on the coded bits of each of the slots, as described in connection with FIG. 7. As another example, when interleaving on a per segment basis over multiple segments (each segment including multiple contiguous slots), the UE may perform a separate interleaver process on the coded bits of each segment, as described in connection with FIG. 8.

In a fourth operation 920, the UE may transmit, and the base station may receive, the communication. For example, the communication may include an encoded transport block that is generated based at least in part on one or more interleaved encoded bit sequences (such as a plurality of interleaved encoded bit sequences. As noted above, in some aspects, the communication may be a PUSCH transmission that includes a single transport block, and the MST occasion may be an MSPT occasion.

In a fifth operation 925, the base station may demap the encoded codeblock to obtain soft information on the transmitted bits. For example, in some aspects, the base station may demap the encoded codeblock to obtain the soft information, as described in more detail in connection with FIG. 3.

In a sixth operation 930, the base station may de-interleave the soft information to form de-interleaved soft information, on a per slot basis or per segment basis. In some aspects, the base station may de-interleave on a per segment basis for each of a plurality of segments, where each segment spans at least two slots and includes one of the one or more sets of contiguous time domain resources, as described in connection with FIG. 8.

In some aspects, when de-interleaving on the per slot basis, the base station may de-interleave a first subset of the soft information for a first slot of the MST occasion and de-interleave a second subset of the soft information for a second slot of the MST occasion. In such examples, the first slot and the second slot may be contiguous of one another. In some aspects, the MST occasion may consist of a single set of contiguous time domain resources that span the first slot and the second slot.

In some aspects, when de-interleaving on the per segment basis, the base station may de-interleave a first subset of the soft information for a first segment of the MST occasion and de-interleave a second subset of the soft information for a second segment of the MST occasion. In such examples, the first segment and the second segment may be associated with a single physical channel. In some aspects, the one or more sets of contiguous time domain resources for the MST occasion may include multiple sets of contiguous time domain resources, and each set of contiguous time domain resources may span two or more contiguous slots. In such examples, different sets of contiguous time domain resources may not be contiguous with one another, and each set of contiguous time domain resources is associated with a corresponding segment.

In some aspects, the codeblock may be one of multiple codeblocks of the communication. In such examples, the base station may de-interleave on the per slot basis or the per segment basis based at least in part on the codeblock spanning across two slots or two segments. For example, the base station may not de-interleave codeblocks on the per slot or per segment basis in a situation where a codeblock spans only a single slot.

In a seventh operation 935, the base station may concatenate the de-interleaved soft information to form concatenated soft information. In an eighth operation 940, the base station may decode the concatenated soft information to infer one or more codeblocks of the communication. For example, the base station may decode the transmitted bits based on the concatenated soft information that is presented as input to the decoder. The decoding block partitions the concatenated soft information to identify the soft information associated with each encoded codeblock. Each such partition is then used to decode the actual transmitted bits corresponded to that codeblock.

Figure 10:
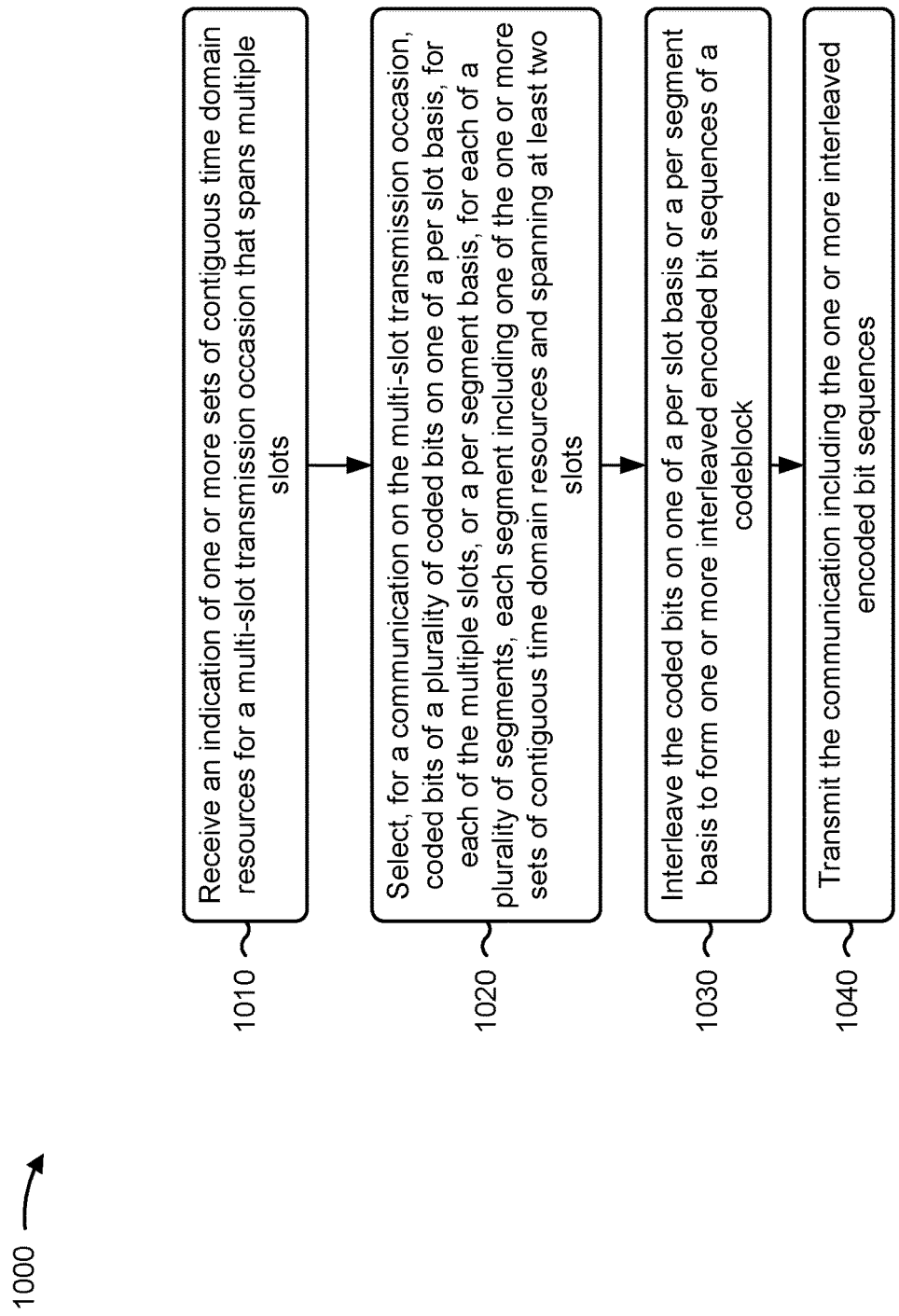
FIG. 10 is a flowchart illustrating an example process for multi-slot uplink shared channel transmission performed, for example, by a UE in accordance with the present disclosure.

FIG. 10 is a flowchart illustrating an example process 1000 performed, for example, by a user equipment (UE) in accordance with the present disclosure. Example process 1000 is an example where the UE (for example, UE 120) performs operations associated with interleaver design for multi-slot uplink.

As shown in FIG. 10, in some aspects, process 1000 may include receiving an indication of one or more sets of contiguous time domain resources for a multi-slot transmission occasion that spans multiple slots (block 1010). For example, the UE (such as by using reception component 1202, depicted in FIG. 12) may receive an indication of one or more sets of contiguous time domain resources for a multi-slot transmission occasion that spans multiple slots, as described above.

As further shown in FIG. 10, in some aspects, process 1000 may include selecting, for a communication on the multi-slot transmission occasion, coded bits of a plurality of coded bits on one of: a per slot basis, for each of the multiple slots, or a per segment basis, for each of a plurality of segments, each segment including one of the one or more sets of contiguous time domain resources and spanning across at least two slots (block 1020). For example, the UE (such as by using selection component 1210, depicted in FIG. 12) may select, for a communication on the multi-slot transmission occasion, coded bits of a plurality of coded bits on one of: a per slot basis, for each of the multiple slots, or a per segment basis, for each of a plurality of segments, each segment including one of the one or more sets of contiguous time domain resources and spanning across at least two slots, as described above.

As further shown in FIG. 10, in some aspects, process 1000 may include interleaving the coded bits on one of a per slot basis or a per segment basis to form one or more interleaved encoded bit sequences of a codeblock (block 1030). For example, the UE (such as by using interleaving component 1212, depicted in FIG. 12) may interleave the coded bits on one of a per slot basis or a per segment basis to form one or more interleaved encoded bit sequences of a codeblock, as described above.

As further shown in FIG. 10, in some aspects, process 1000 may include transmitting the communication including the one or more interleaved encoded bit sequences (block 1040). For example, the UE (such as by using transmission component 1206, depicted in FIG. 12) may transmit the communication including the one or more interleaved encoded bit sequences, as described above.

Process 1000 may include additional aspects, such as any single aspect or any combination of aspects described below or in connection with one or more other processes described elsewhere herein.

In a first additional aspect, selecting the coded bits on the per slot basis comprises selecting a first subset of the plurality of coded bits for a first slot of the multi-slot transmission occasion, and selecting a second subset of the plurality of coded bits for a second slot of the multi-slot transmission occasion, wherein the first slot and the second slot are contiguous.

In a second additional aspect, alone or in combination with the first aspect, the one or more sets of contiguous time domain resources for the multi-slot transmission occasion consists of a single set of contiguous time domain resources that span the first slot and the second slot, wherein the first slot and the second slot are contiguous with one another.

In a third additional aspect, alone or in combination with one or more of the first and second aspects, selecting the coded bits on the per segment basis comprises selecting a first subset of a plurality of coded bits for a first segment of the multi-slot transmission occasion, and selecting a second subset of the plurality of coded bits for a second segment of the multi-slot transmission occasion, wherein the first segment and the second segment are associated with a single physical channel.

In a fourth additional aspect, alone or in combination with one or more of the first through third aspects, the one or more sets of contiguous time domain resources for the multi-slot transmission occasion comprises multiple sets of contiguous time domain resources, wherein each set of contiguous time domain resources spans two or more contiguous slots, wherein different sets of contiguous time domain resources are not contiguous with one another, and wherein each set of contiguous time domain resources, of the multiple sets of contiguous time domain resources, is associated with a corresponding segment of the plurality of segments.

In a fifth additional aspect, alone or in combination with one or more of the first through fourth aspects, the communication is a physical uplink shared channel (PUSCH) transmission that includes a single transport block, and wherein the multi-slot transmission occasion is a multi-slot PUSCH transmission occasion.

In a sixth additional aspect, alone or in combination with one or more of the first through fifth aspects, interleaving the coded bits to form the one or more interleaved encoded bit sequences is performed on a per slot basis, and wherein the one or more sets of contiguous time domain resources are associated with redundancy version indexes on a per slot basis.

In a seventh additional aspect, alone or in combination with one or more of the first through sixth aspects, interleaving the coded bits to form the one or more interleaved encoded bit sequences is performed on a per transmission occasion basis, and wherein the one or more sets of contiguous time domain resources are associated with redundancy version indexes on a per transmission occasion basis.

In an eighth additional aspect, alone or in combination with one or more of the first through seventh aspects, interleaving the coded bits to form the one or more interleaved encoded bit sequences is performed on a per segment basis, and wherein the one or more sets of contiguous time domain resources are associated with redundancy version indexes on a per segment basis.

In a ninth additional aspect, alone or in combination with one or more of the first through eighth aspects, interleaving the coded bits to form the one or more interleaved encoded bit sequences is performed on a per slot basis, and wherein the one or more sets of contiguous time domain resources are associated with redundancy version indexes on a per transmission occasion basis or a per segment basis.

In a tenth additional aspect, alone or in combination with one or more of the first through ninth aspects, interleaving the coded bits to form the one or more interleaved encoded bit sequences is performed on a per slot basis or a per segment basis, and wherein the one or more sets of contiguous time domain resources are associated with redundancy version indexes on a per slot basis.

In an eleventh additional aspect, alone or in combination with one or more of the first through tenth aspects, the codeblock is one of multiple codeblocks of the communication, and wherein selecting the coded bits on the per slot basis or the per segment basis is based at least in part on the codeblock spanning across two slots or two segments.

In a twelfth additional aspect, alone or in combination with one or more of the first through eleventh aspects, the interleaving is performed based at least in part on the communication being associated with a modulation and coding scheme (MCS) that satisfies a threshold, wherein interleaving is deactivated for communications associated with an MCS that fails to satisfy the threshold.

Although FIG. 10 shows example blocks of process 1000, in some aspects, process 1000 may include additional blocks, fewer blocks, different blocks, or differently arranged blocks than those depicted in FIG. 10. Additionally or alternatively, two or more of the blocks of process 1000 may be performed in parallel.

Figure 11:
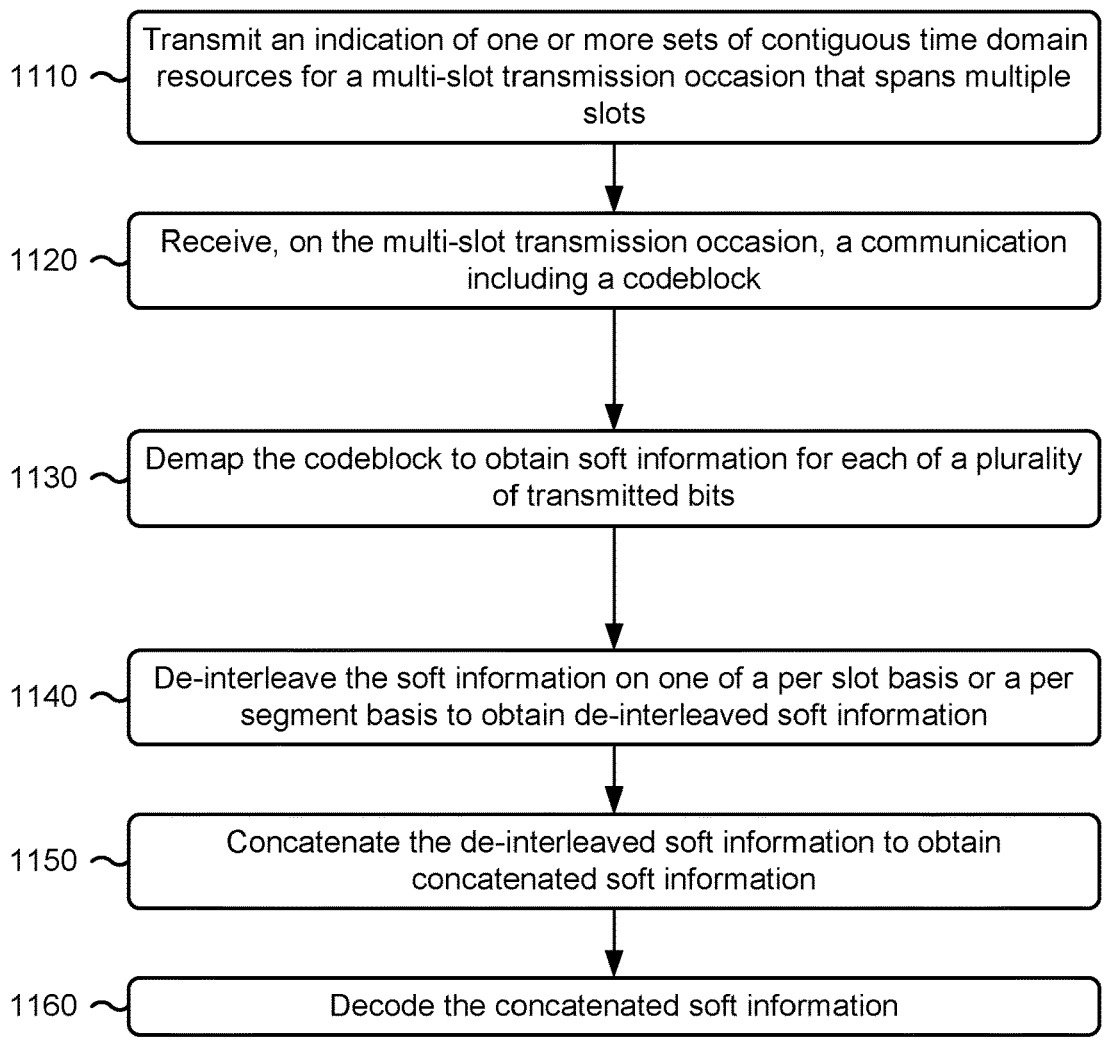
FIG. 11 is a flowchart illustrating an example process for multi-slot uplink shared channel transmission performed, for example, by a base station in accordance with the present disclosure.

FIG. 11 is a flowchart illustrating an example process 1100 performed, for example, by a base station in accordance with the present disclosure. Example process 1100 is an example where the base station (for example, base station 110) performs operations associated with interleaver design for multi-slot uplink.

As shown in FIG. 11, in some aspects, process 1100 may include transmitting an indication of one or more sets of contiguous time domain resources for a multi-slot transmission occasion that spans multiple slots (block 1110). For example, the base station (such as by using transmission component 1306, depicted in FIG. 13) may transmit an indication of one or more sets of contiguous time domain resources for a multi-slot transmission occasion that spans multiple slots, as described above.

As further shown in FIG. 11, in some aspects, process 1100 may include receiving, on the multi-slot transmission occasion, a communication including an interleaved encoded bit sequence of a codeblock (block 1120). For example, the base station (such as by using reception component 1302, depicted in FIG. 13) may receive, on the multi-slot transmission occasion, a communication including an interleaved encoded bit sequence of a codeblock, as described above.

As further shown in FIG. 11, in some aspects, process 1100 may include demapping the codeblock to obtain soft information for each of a plurality of transmitted bits (block 1130). For example, the base station (such as by using demapping component 1310, depicted in FIG. 13) may demap the codeblock to obtain soft information for each of a plurality of transmitted bits, as described above.

As further shown in FIG. 11, in some aspects, process 1100 may include de-interleaving, to obtain de-interleaved soft information, the soft information on one of: a per slot basis, for each of the multiple slots, or a per segment basis, for each of a plurality of segments, each segment including one of the one or more sets of contiguous time domain resources and spanning across at least two slots (block 1140). For example, the base station (such as by using de-interleaving component 1312, depicted in FIG. 13) may de-interleave, to obtain de-interleaved soft information, the soft information on one of: a per slot basis, for each of the multiple slots, or a per segment basis, for each of a plurality of segments, each segment including one of the one or more sets of contiguous time domain resources and spanning across at least two slots, as described above.

As further shown in FIG. 11, in some aspects, process 1100 may include concatenating the de-interleaved soft information to obtain concatenated soft information (block 1150). For example, the base station (such as by using concatenating component 1314, depicted in FIG. 13) may concatenate the de-interleaved soft information to obtain concatenated soft information, as described above.

As further shown in FIG. 11, in some aspects, process 1100 may include decoding the concatenated soft information to infer one or more codeblocks of the communication (block 1160). For example, the base station (such as by using decoding component 1316, depicted in FIG. 13) may decode the concatenated soft information to infer one or more codeblocks of the communication, as described above.

Process 1100 may include additional aspects, such as any single aspect or any combination of aspects described below or in connection with one or more other processes described elsewhere herein.

In a first additional aspect, the one or more sets of contiguous time domain resources for the multi-slot transmission occasion consists of a single set of contiguous time domain resources that span the first slot and the second slot.

In a second additional aspect, alone or in combination with the first aspect, the one or more sets of contiguous time domain resources for the multi-slot transmission occasion comprise multiple sets of contiguous time domain resources, wherein each set of contiguous time domain resources spans two or more contiguous slots, wherein different sets of contiguous time domain resources are not contiguous with one another, and wherein each set of contiguous time domain resources, of the multiple sets of contiguous time domain resources, is associated with a corresponding segment of the plurality of segments.

In a third additional aspect, alone or in combination with one or more of the first and second aspects, the communication is a physical uplink shared channel (PUSCH) transmission that includes a single transport block, and wherein the multi-slot transmission occasion is a multi-slot PUSCH transmission occasion.

In a fourth additional aspect, alone or in combination with one or more of the first through third aspects, ding-interleaving is performed on a per slot basis, and wherein the one or more sets of contiguous time domain resources are associated with redundancy version indexes on a per slot basis.

In a fifth additional aspect, alone or in combination with one or more of the first through fourth aspects, ding-interleaving is performed on a per transmission occasion basis, and wherein the one or more sets of contiguous time domain resources are associated with redundancy version indexes on a per transmission occasion basis.

In a sixth additional aspect, alone or in combination with one or more of the first through fifth aspects, ding-interleaving is performed on a per segment basis, and wherein the one or more sets of contiguous time domain resources are associated with redundancy version indexes on a per segment basis.

In a seventh additional aspect, alone or in combination with one or more of the first through sixth aspects, ding-interleaving is performed on a per slot basis, and wherein the one or more sets of contiguous time domain resources are associated with redundancy version indexes on a per transmission occasion basis or a per segment basis.

In an eighth additional aspect, alone or in combination with one or more of the first through seventh aspects, ding-interleaving is performed on a per slot basis or a per segment basis, and wherein redundancy version indexes are assigned on a per transmission occasion basis for the one or more sets of contiguous time domain resources are associated with redundancy version indexes on a per slot basis.

Although FIG. 11 shows example blocks of process 1100, in some aspects, process 1100 may include additional blocks, fewer blocks, different blocks, or differently arranged blocks than those depicted in FIG. 11. Additionally or alternatively, two or more of the blocks of process 1100 may be performed in parallel.

Figure 12:
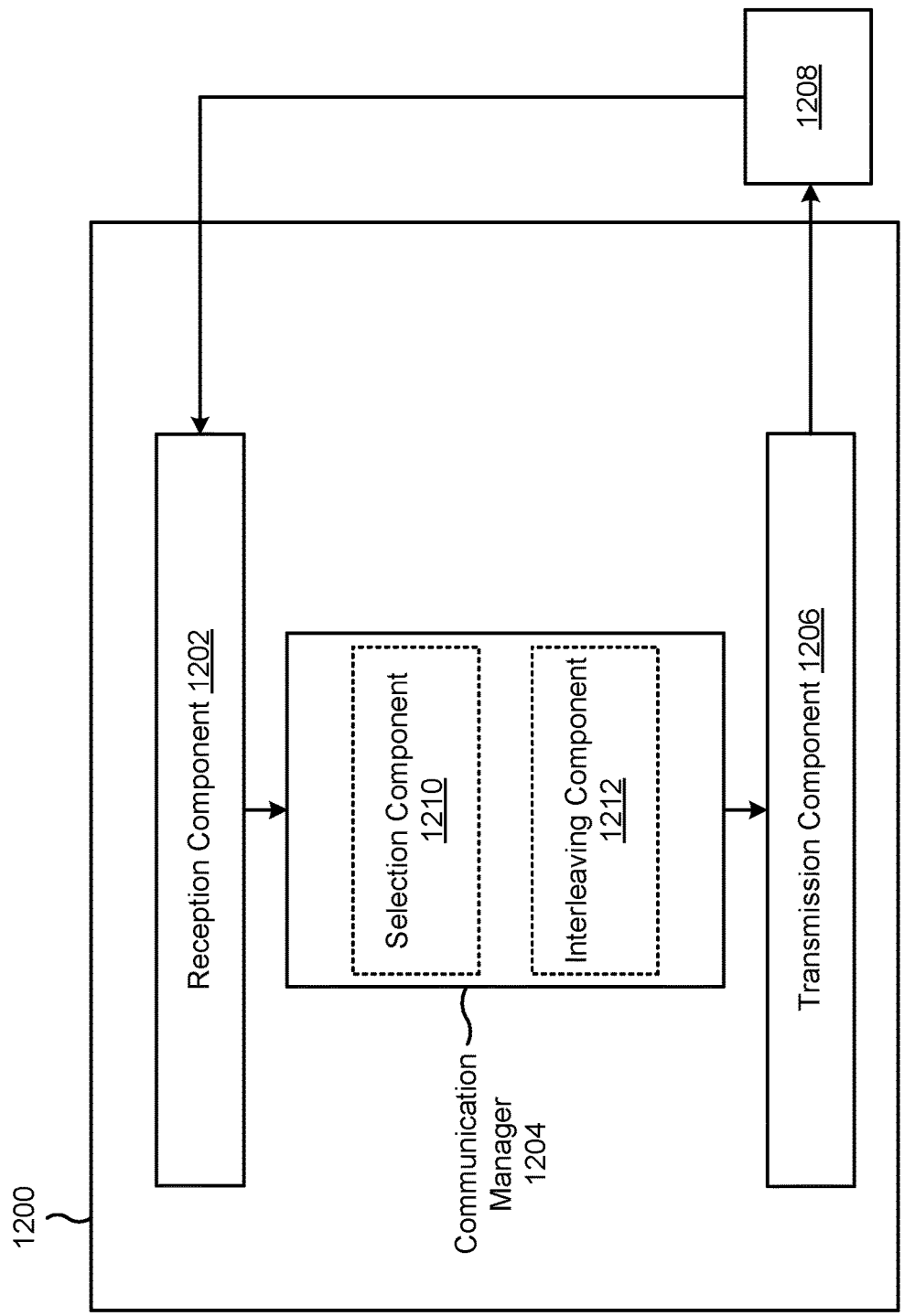
FIGS. 12 and 13 are block diagrams of example apparatuses for wireless communication in accordance with the present disclosure.

FIG. 12 is a block diagram of an example apparatus 1200 for wireless communication in accordance with the present disclosure. The apparatus 1200 may be a UE, or a UE may include the apparatus 1200. In some aspects, the apparatus 1200 includes a reception component 1202, a communication manager 1204, and a transmission component 1206, which may be in communication with one another (for example, via one or more buses). As shown, the apparatus 1200 may communicate with another apparatus 1208 (such as a UE, a base station, or another wireless communication device) using the reception component 1202 and the transmission component 1206.

In some aspects, the apparatus 1200 may be configured to perform one or more operations described herein in connection with FIGS. 3-9. Additionally or alternatively, the apparatus 1200 may be configured to perform one or more processes described herein, such as process 1000 of FIG. 10. In some aspects, the apparatus 1200 may include one or more components of the UE described above in connection with FIG. 2.

The reception component 1202 may receive communications, such as reference signals, control information, data communications, or a combination thereof, from the apparatus 1208. The reception component 1202 may provide received communications to one or more other components of the apparatus 1200, such as the communication manager 1204. In some aspects, the reception component 1202 may perform signal processing on the received communications (such as filtering, amplification, demodulation, analog-to-digital conversion, demultiplexing, deinterleaving, demapping, equalization, interference cancellation, or decoding, among other examples), and may provide the processed signals to the one or more other components. In some aspects, the reception component 1202 may include one or more antennas, a demodulator, a MIMO detector, a receive processor, a controller/processor, a memory, or a combination thereof, of the UE described above in connection with FIG. 2.

The transmission component 1206 may transmit communications, such as reference signals, control information, data communications, or a combination thereof, to the apparatus 1208. In some aspects, the communication manager 1204 may generate communications and may transmit the generated communications to the transmission component 1206 for transmission to the apparatus 1208. In some aspects, the transmission component 1206 may perform signal processing on the generated communications (such as filtering, amplification, modulation, digital-to-analog conversion, multiplexing, interleaving, mapping, or encoding, among other examples), and may transmit the processed signals to the apparatus 1208. In some aspects, the transmission component 1206 may include one or more antennas, a modulator, a transmit MIMO processor, a transmit processor, a controller/processor, a memory, or a combination thereof, of the UE described above in connection with FIG. 2. In some aspects, the transmission component 1206 may be co-located with the reception component 1202 in a transceiver.

The communication manager 1204 may receive or may cause the reception component 1202 to receive an indication of one or more sets of contiguous time domain resources for a multi-slot transmission occasion that spans multiple slots. The communication manager 1204 may select, for a communication on the multi-slot transmission occasion, coded bits of a plurality of coded bits on one of a per slot basis, for each of the multiple slots, or a per segment basis, for each of a plurality of segments, each segment including one of the one or more sets of contiguous time domain resources and spanning across at least two slots. The communication manager 1204 may interleave the coded bits on one of a per slot basis or a per segment basis to form one or more interleaved encoded bit sequences of a codeblock. The communication manager 1204 may transmit or may cause the transmission component 1206 to transmit the communication including the encoded codeblock. In some aspects, the communication manager 1204 may perform one or more operations described elsewhere herein as being performed by one or more components of the communication manager 1204.

The communication manager 1204 may include a controller/processor, a memory, or a combination thereof, of the UE described above in connection with FIG. 2. In some aspects, the communication manager 1204 includes a set of components, such as a selection component 1210, a interleaving component 1212, or a combination thereof. Alternatively, the set of components may be separate and distinct from the communication manager 1204. In some aspects, one or more components of the set of components may include or may be implemented within a controller/processor, a memory, or a combination thereof, of the UE described above in connection with FIG. 2. Additionally or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 1202 may receive an indication of one or more sets of contiguous time domain resources for a multi-slot transmission occasion that spans multiple slots. The selection component 1210 may select, for a communication on the multi-slot transmission occasion, coded bits of a plurality of coded bits on one of a per slot basis, for each of the multiple slots, or a per segment basis, for each of a plurality of segments, each segment including one of the one or more sets of contiguous time domain resources and spanning across at least two slots. The interleaving component 1212 may interleave the coded bits on one of a per slot basis or a per segment basis to form one or more interleaved encoded bit sequences of a codeblock. The transmission component 1206 may transmit the communication including the codeblock.

The number and arrangement of components shown in FIG. 12 are provided as an example. In practice, there may be additional components, fewer components, different components, or differently arranged components than those shown in FIG. 12. Furthermore, two or more components shown in FIG. 12 may be implemented within a single component, or a single component shown in FIG. 12 may be implemented as multiple, distributed components. Additionally or alternatively, a set of (one or more) components shown in FIG. 12 may perform one or more functions described as being performed by another set of components shown in FIG. 12.

Figure 13:
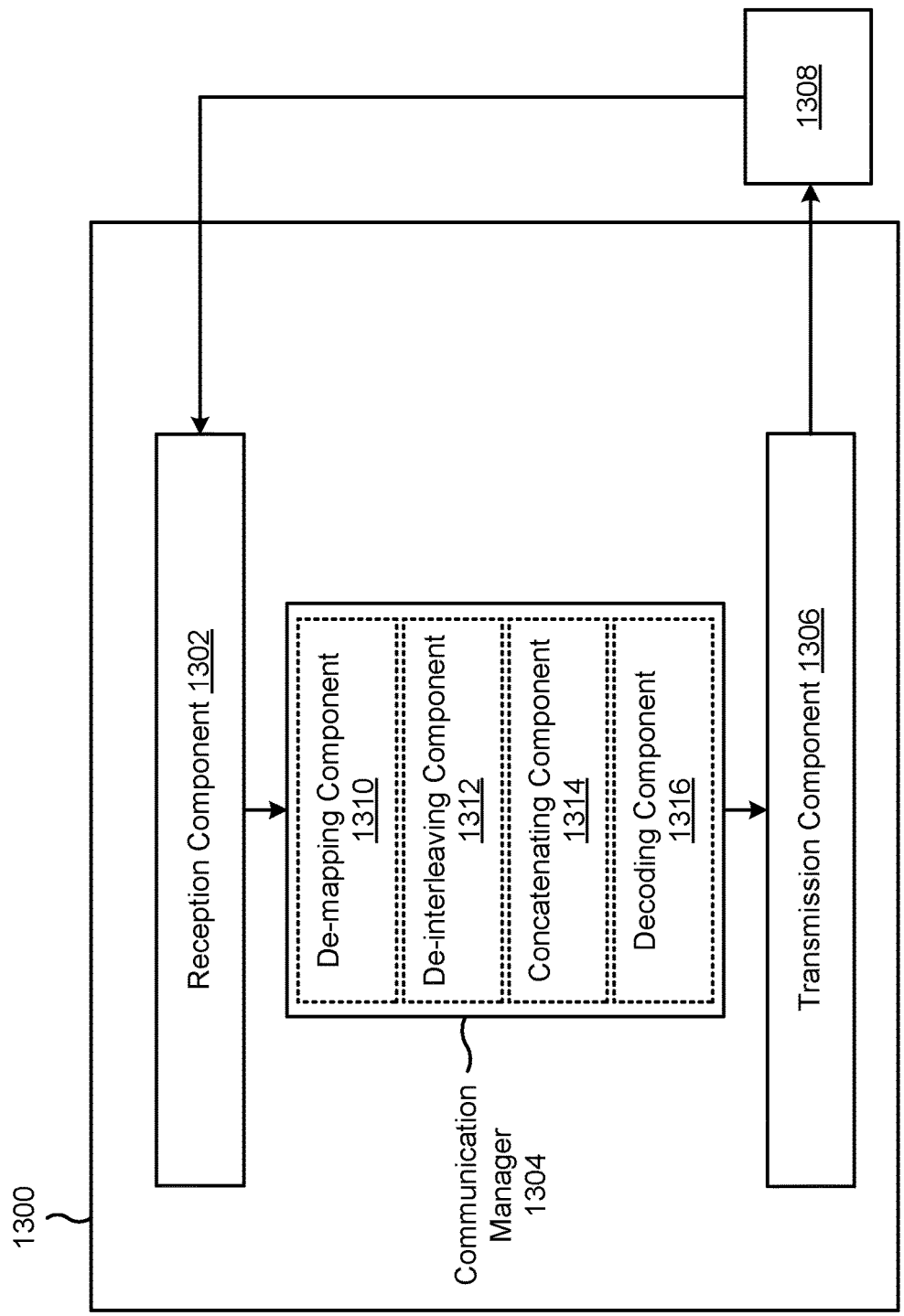

FIG. 13 is a block diagram of an example apparatus 1300 for wireless communication in accordance with the present disclosure. The apparatus 1300 may be a base station, or a base station may include the apparatus 1300. In some aspects, the apparatus 1300 includes a reception component 1302, a communication manager 1304, and a transmission component 1306, which may be in communication with one another (for example, via one or more buses). As shown, the apparatus 1300 may communicate with another apparatus 1308 (such as a UE, a base station, or another wireless communication device) using the reception component 1302 and the transmission component 1306.

In some aspects, the apparatus 1300 may be configured to perform one or more operations described herein in connection with FIGS. 3-9. Additionally or alternatively, the apparatus 1300 may be configured to perform one or more processes described herein, such as process 1100 of FIG. 11. In some aspects, the apparatus 1300 may include one or more components of the base station described above in connection with FIG. 2.

The reception component 1302 may receive communications, such as reference signals, control information, data communications, or a combination thereof, from the apparatus 1308. The reception component 1302 may provide received communications to one or more other components of the apparatus 1300, such as the communication manager 1304. In some aspects, the reception component 1302 may perform signal processing on the received communications (such as filtering, amplification, demodulation, analog-to-digital conversion, demultiplexing, deinterleaving, demapping, equalization, interference cancellation, or decoding, among other examples), and may provide the processed signals to the one or more other components. In some aspects, the reception component 1302 may include one or more antennas, a demodulator, a MIMO detector, a receive processor, a controller/processor, a memory, or a combination thereof, of the base station described above in connection with FIG. 2.

The transmission component 1306 may transmit communications, such as reference signals, control information, data communications, or a combination thereof, to the apparatus 1308. In some aspects, the communication manager 1304 may generate communications and may transmit the generated communications to the transmission component 1306 for transmission to the apparatus 1308. In some aspects, the transmission component 1306 may perform signal processing on the generated communications (such as filtering, amplification, modulation, digital-to-analog conversion, multiplexing, interleaving, mapping, or encoding, among other examples), and may transmit the processed signals to the apparatus 1308. In some aspects, the transmission component 1306 may include one or more antennas, a modulator, a transmit MIMO processor, a transmit processor, a controller/processor, a memory, or a combination thereof, of the base station described above in connection with FIG. 2. In some aspects, the transmission component 1306 may be co-located with the reception component 1302 in a transceiver.

The communication manager 1304 may transmit or may cause the transmission component 1306 to transmit an indication of one or more sets of contiguous time domain resources for a multi-slot transmission occasion that spans multiple slots. The communication manager 1304 may receive or may cause the reception component 1302 to receive, on the multi-slot transmission occasion, a communication including an interleaved encoded bit sequence of a codeblock. The communication manager 1304 may demap the codeblock to obtain soft information for each of a plurality of transmitted bits. The communication manager 1304 may de-interleave the soft information on one of the per slot basis or the per segment basis to obtain de-interleaved soft information. The communication manager 1304 may concatenate the de-interleaved soft information to obtain concatenated soft information. The communication manager 1304 may decode the concatenated soft information to infer one or more codeblocks of the communication. In some aspects, the communication manager 1304 may perform one or more operations described elsewhere herein as being performed by one or more components of the communication manager 1304.

The communication manager 1304 may include a controller/processor, a memory, a scheduler, a communication unit, or a combination thereof, of the base station described above in connection with FIG. 2. In some aspects, the communication manager 1304 includes a set of components, such as a demapping component 1310, a de-interleaving component 1312, a concatenating component 1314, a decoding component 1316, or a combination thereof. Alternatively, the set of components may be separate and distinct from the communication manager 1304. In some aspects, one or more components of the set of components may include or may be implemented within a controller/processor, a memory, a scheduler, a communication unit, or a combination thereof, of the base station described above in connection with FIG. 2. Additionally or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The transmission component 1306 may transmit an indication of one or more sets of contiguous time domain resources for a multi-slot transmission occasion that spans multiple slots. The reception component 1302 may receiving, on the multi-slot transmission occasion, a communication including a codeblock. The demapping component 1310 may demap the codeblock to obtain soft information for each of a plurality of transmitted bits. The de-interleaving component 1312 may de-interleave the soft information on one of the per slot basis or the per segment basis to obtain de-interleaved soft information. The concatenating component 1314 may concatenate the de-interleaved soft information to obtain concatenated soft information. The decoding component 1316 may decode the concatenated soft information to infer one or more codeblocks of the communication.

The number and arrangement of components shown in FIG. 13 are provided as an example. In practice, there may be additional components, fewer components, different components, or differently arranged components than those shown in FIG. 13. Furthermore, two or more components shown in FIG. 13 may be implemented within a single component, or a single component shown in FIG. 13 may be implemented as multiple, distributed components. Additionally or alternatively, a set of (one or more) components shown in FIG. 13 may perform one or more functions described as being performed by another set of components shown in FIG. 13.

The following provides an overview of some Aspects of the present disclosure:

Aspect 1: A method of wireless communication performed by a user equipment (UE), comprising: receiving an indication of one or more sets of contiguous time domain resources for a multi-slot transmission occasion that spans multiple slots; selecting, for a communication on the multi-slot transmission occasion, coded bits of a plurality of coded bits on one of: a per slot basis, for each of the multiple slots, or a per segment basis, for each of a plurality of segments, each segment including one of the one or more sets of contiguous time domain resources and spanning across at least two slots; interleaving the coded bits on one of a per slot basis or a per segment basis to form one or more interleaved encoded bit sequences of a codeblock; and transmitting the communication including the one or more interleaved encoded bit sequences.

Aspect 2: The method of Aspect 1, wherein selecting the coded bits on the per slot basis comprises: selecting a first subset of the plurality of coded bits for a first slot of the multi-slot transmission occasion; and selecting a second subset of the plurality of coded bits for a second slot of the multi-slot transmission occasion, wherein the first slot and the second slot are contiguous.

Aspect 3: The method of Aspect 2, wherein the one or more sets of contiguous time domain resources for the multi-slot transmission occasion consists of a single set of contiguous time domain resources that span the first slot and the second slot, wherein the first slot and the second slot are contiguous with one another.

Aspect 4: The method of Aspect 1, wherein selecting the coded bits on the per segment basis comprises: selecting a first subset of a plurality of coded bits for a first segment of the multi-slot transmission occasion; and selecting a second subset of the plurality of coded bits for a second segment of the multi-slot transmission occasion, wherein the first segment and the second segment are associated with a single physical channel.

Aspect 5: The method of Aspect 4, wherein the one or more sets of contiguous time domain resources for the multi-slot transmission occasion comprises multiple sets of contiguous time domain resources, wherein each set of contiguous time domain resources spans two or more contiguous slots, wherein different sets of contiguous time domain resources are not contiguous with one another, and wherein each set of contiguous time domain resources, of the multiple sets of contiguous time domain resources, is associated with a corresponding segment of the plurality of segments.

Aspect 6: The method of Aspect 1, wherein the communication is a physical uplink shared channel (PUSCH) transmission that includes a single transport block, and wherein the multi-slot transmission occasion is a multi-slot PUSCH transmission occasion.

Aspect 7: The method of Aspect 1, wherein interleaving the coded bits to form the one or more interleaved encoded bit sequences is performed on a per slot basis, and wherein the one or more sets of contiguous time domain resources are associated with redundancy version indexes on a per slot basis.

Aspect 8: The method of Aspect 1, wherein interleaving the coded bits to form the one or more interleaved encoded bit sequences is performed on a per transmission occasion basis, and wherein the one or more sets of contiguous time domain resources are associated with redundancy version indexes on a per transmission occasion basis.

Aspect 9: The method of Aspect 1, wherein interleaving the coded bits to form the one or more interleaved encoded bit sequences is performed on a per segment basis, and wherein the one or more sets of contiguous time domain resources are associated with redundancy version indexes on a per segment basis.

Aspect 10: The method of Aspect 1, wherein interleaving the coded bits to form the one or more interleaved encoded bit sequences is performed on a per slot basis, and wherein the one or more sets of contiguous time domain resources are associated with redundancy version indexes on a per transmission occasion basis or a per segment basis.

Aspect 11: The method of Aspect 1, wherein interleaving the coded bits to form the one or more interleaved encoded bit sequences is performed on a per slot basis or a per segment basis, and wherein the one or more sets of contiguous time domain resources are associated with redundancy version indexes on a per slot basis.

Aspect 12: The method of Aspect 1, wherein the codeblock is one of multiple codeblocks of the communication, and wherein selecting the coded bits on the per slot basis or the per segment basis is based at least in part on the codeblock spanning across two slots or two segments.

Aspect 13: A method of wireless communication performed by a base station, comprising: transmitting an indication of one or more sets of contiguous time domain resources for a multi-slot transmission occasion that spans multiple slots; receiving, on the multi-slot transmission occasion, a communication including a codeblock; demapping the codeblock to obtain soft information for each of a plurality of transmitted bits: de-interleaving, to obtain de-interleaved soft information, the soft information on one of: concatenating the de-interleaved soft information to obtain concatenated soft information; and decoding the concatenated soft information to infer one or more codeblocks of the communication.

Aspect 14: The method of Aspect 14, wherein the one or more sets of contiguous time domain resources for the multi-slot transmission occasion consists of a single set of contiguous time domain resources that span the first slot and the second slot.

Aspect 15: The method of Aspect 14, wherein the one or more sets of contiguous time domain resources for the multi-slot transmission occasion comprise multiple sets of contiguous time domain resources, wherein each set of contiguous time domain resources spans two or more contiguous slots, wherein different sets of contiguous time domain resources are not contiguous with one another, and wherein each set of contiguous time domain resources, of the multiple sets of contiguous time domain resources, is associated with a corresponding segment of the plurality of segments.

Aspect 16: The method of Aspect 14, wherein the communication is a physical uplink shared channel (PUSCH) transmission that includes a single transport block, and wherein the multi-slot transmission occasion is a multi-slot PUSCH transmission occasion.

Aspect 17: The method of Aspect 14, wherein de-interleaving is performed on a per slot basis, and wherein the one or more sets of contiguous time domain resources are associated with redundancy version indexes on a per slot basis.

Aspect 18: The method of Aspect 14, wherein de-interleaving is performed on a per transmission occasion basis, and wherein the one or more sets of contiguous time domain resources are associated with redundancy version indexes on a per transmission occasion basis.

Aspect 19: The method of Aspect 14, wherein de-interleaving is performed on a per segment basis, and wherein the one or more sets of contiguous time domain resources are associated with redundancy version indexes on a per segment basis.

Aspect 20: The method of Aspect 14, wherein de-interleaving is performed on a per slot basis, and wherein the one or more sets of contiguous time domain resources are associated with redundancy version indexes on a per transmission occasion basis or a per segment basis.

Aspect 21: The method of Aspect 14, wherein de-interleaving is performed on a per slot basis or a per segment basis, and wherein redundancy version indexes are assigned on a per transmission occasion basis for the one or more sets of contiguous time domain resources are associated with redundancy version indexes on a per slot basis.

Aspect 22: An apparatus for wireless communication at a device, comprising a processor; memory coupled with the processor; and instructions stored in the memory and executable by the processor to cause the apparatus to perform the method of one or more Aspects of Aspects 1-21.

Aspect 23: A device for wireless communication, comprising a memory and one or more processors coupled to the memory, the memory and the one or more processors configured to perform the method of one or more Aspects of Aspects 1-21.

Aspect 24: An apparatus for wireless communication, comprising at least one means for performing the method of one or more Aspects of Aspects 1-21.

Aspect 25: A non-transitory computer-readable medium storing code for wireless communication, the code comprising instructions executable by a processor to perform the method of one or more Aspects of Aspects 1-21.

Aspect 26: A non-transitory computer-readable medium storing a set of instructions for wireless communication, the set of instructions comprising one or more instructions that, when executed by one or more processors of a device, cause the device to perform the method of one or more Aspects of Aspects 1-21.

The foregoing disclosure provides illustration and description, but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware, firmware, or a combination of hardware and software. As used herein, a processor is implemented in hardware, firmware, or a combination of hardware and software. It will be apparent that systems or methods described herein may be implemented in different forms of hardware, firmware, or a combination of hardware and software. The actual specialized control hardware or software code used to implement these systems or methods is not limiting of the aspects. Thus, the operation and behavior of the systems or methods were described herein without reference to specific software code—it being understood that software and hardware can be designed to implement the systems or methods based, at least in part, on the description herein.

As used herein, satisfying a threshold may, depending on the context, refer to a value being greater than the threshold, greater than or equal to the threshold, less than the threshold, less than or equal to the threshold, equal to the threshold, or not equal to the threshold, among other examples.

Even though particular combinations of features are recited in the claims or disclosed in the specification, these combinations are not intended to limit the disclosure of various aspects. In fact, many of these features may be combined in ways not specifically recited in the claims or disclosed in the specification. Although each dependent claim listed below may directly depend on only one claim, the disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (for example, a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items (for example, related items, unrelated items, or a combination of related and unrelated items), and may be used interchangeably with "one or more." Where only one item is intended, the phrase "only one" or similar language is used. Also, as used herein, the terms "has," "have," "having," and similar terms are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (for example, if used in combination with "either" or "only one of").

What is claimed is:

1. An apparatus for wireless communication, comprising:
a memory; and
one or more processors coupled to the memory, wherein the one or more processors are configured to:
select, for a communication on a multi-slot transmission occasion, coded bits of a plurality of coded bits on a per slot basis for each respective slot of multiple slots of the multi-slot transmission occasion;
interleave, based at least in part on the communication being associated with a modulation and coding scheme (MCS) that satisfies a threshold, the coded bits on a per slot basis to form one or more interleaved encoded bit sequences of a codeblock, wherein interleaving is deactivated for communications associated with an MCS that fails to satisfy the threshold; and
transmit the communication including the one or more interleaved encoded bit sequences.

2. The apparatus of claim 1, wherein the one or more processors, to select the coded bits on the per slot basis, are configured to:
select a first subset of the plurality of coded bits for a first slot of the multiple slots of the multi-slot transmission occasion; and
select a second subset of the plurality of coded bits for a second slot of the multiple slots of the multi-slot transmission occasion.

3. The apparatus of claim 2, wherein one or more sets of time domain resources for the multi-slot transmission occasion consists of a single set of contiguous time domain resources that span the first slot and the second slot.

4. The apparatus of claim 1, wherein the communication is a physical uplink shared channel (PUSCH) transmission that includes a single transport block, and wherein the multi-slot transmission occasion is a multi-slot PUSCH transmission occasion.

5. The apparatus of claim 1, wherein one or more sets of time domain resources for the multi-slot transmission occasion are associated with redundancy version indexes on a per slot basis.

6. The apparatus of claim 1, wherein one or more sets of time domain resources for the multi-slot transmission occasion are associated with redundancy version indexes on a per transmission occasion basis or a per segment basis.

7. The apparatus of claim 1, wherein the codeblock is one of multiple codeblocks of the communication, and wherein selecting the coded bits on the per slot basis is based at least in part on the codeblock spanning across two slots or two segments.

8. The apparatus of claim 1, wherein the one or more processors are further configured to:
receive an indication of one or more sets of contiguous time domain resources for the multi-slot transmission occasion.

9. An apparatus for wireless communication, comprising:
a memory; and
one or more processors coupled to the memory, wherein the one or more processors are configured to:
select, for a first communication on a multi-slot transmission occasion, coded bits of a plurality of coded bits on a per slot basis for each respective slot of multiple slots of the multi-slot transmission occasion;
interleave the coded bits on a per slot basis to form one or more interleaved encoded bit sequences of a codeblock;
transmit the first communication including the one or more interleaved encoded bit sequences; and
interleave second coded bits to form one or more second interleaved encoded bit sequences on a per transmission occasion basis, wherein one or more second sets of time domain resources are associated with redundancy version indexes on a per transmission occasion basis, wherein the one or more second sets of time domain resources are for a second multi-slot transmission occasion associated with transmission of a second communication based at least in part on the one or more second interleaved encoded bit sequences.

10. The apparatus of claim 9, wherein the one or more processors, to select the coded bits on the per slot basis, are configured to:
select a first subset of the plurality of coded bits for a first slot of the multiple slots of the multi-slot transmission occasion; and
select a second subset of the plurality of coded bits for a second slot of the multiple slots of the multi-slot transmission occasion.

11. The apparatus of claim 10, wherein one or more sets of time domain resources for the multi-slot transmission occasion consists of a single set of contiguous time domain resources that span the first slot and the second slot.

12. The apparatus of claim 9, wherein one or more sets of time domain resources for the multi-slot transmission occasion are associated with redundancy version indexes on a per slot basis.

13. The apparatus of claim 9, wherein one or more sets of time domain resources for the multi-slot transmission occasion are associated with redundancy version indexes on a per transmission occasion basis or a per segment basis.

14. An apparatus for wireless communication, comprising:
a memory; and
one or more processors coupled to the memory, wherein the one or more processors are configured to:
select, for a first communication on a multi-slot transmission occasion, coded bits of a plurality of coded bits on a per slot basis for each respective slot of multiple slots of the multi-slot transmission occasion;
interleave the coded bits on a per slot basis to form one or more interleaved encoded bit sequences of a codeblock;
transmit the first communication including the one or more interleaved encoded bit sequences; and
interleave second coded bits to form one or more second interleaved encoded bit sequences on a per segment basis, wherein one or more second sets of time domain resources are associated with redundancy version indexes on a per segment basis, wherein the one or more second sets of time domain resources are for a second multi-slot transmission occasion associated with transmission of a second communication based at least in part on the one or more second interleaved encoded bit sequences.

15. A network entity for wireless communication, comprising:
a memory; and
one or more processors coupled to the memory, wherein the one or more processors are configured to:
receive, on a multi-slot transmission occasion including one or more sets of time domain resources and that spans multiple slots, a communication including an interleaved encoded bit sequence of a codeblock;
demap the first communication to obtain soft information for each of a plurality of transmitted bits;
de-interleave, to obtain de-interleaved soft information, the soft information on a per slot basis, for each respective slot of the multiple slots;
concatenate the de-interleaved soft information to obtain concatenated soft information;
decode the concatenated soft information to infer one or more codeblocks of the first communication; and
de-interleave second soft information associated with a second communication on a per transmission occasion basis, wherein one or more second sets of time domain resources associated with the second communication are associated with redundancy version indexes on a per transmission occasion basis.

16. The network entity of claim 15, wherein the one or more processors are further configured to:
transmit an indication of the one or more sets of time domain resources for the multi-slot transmission occasion.

17. The network entity of claim 15, wherein the one or more sets of time domain resources for the multi-slot transmission occasion consists of a single set of contiguous time domain resources that span across at least two slots.

18. The network entity of claim 15, wherein the first communication is a physical uplink shared channel (PUSCH) transmission that includes a single transport block, and wherein the multi-slot transmission occasion is a multi-slot PUSCH transmission occasion.

19. The network entity of claim 15, wherein the one or more sets of time domain resources are associated with redundancy version indexes on a per slot basis.

20. The network entity of claim 15, wherein de-interleaving is on a per slot basis, and wherein the one or more sets of contiguous time domain resources are associated with redundancy version indexes on a per transmission occasion basis or a per segment basis.

21. The network entity of claim 15, wherein redundancy version indexes are assigned on a per transmission occasion basis for the one or more sets of contiguous time domain resources associated with redundancy version indexes on a per slot basis.

22. A network entity for wireless communication, comprising:
a memory; and
one or more processors coupled to the memory, wherein the one or more processors are configured to:
receive, on a multi-slot transmission occasion including one or more sets of time domain resources and that spans multiple slots, a communication including an interleaved encoded bit sequence of a codeblock;
demap the first communication to obtain soft information for each of a plurality of transmitted bits;
de-interleave, to obtain de-interleaved soft information, the soft information on a per slot basis, for each respective slot of the multiple slots;
concatenate the de-interleaved soft information to obtain concatenated soft information;
decode the concatenated soft information to infer one or more codeblocks of the first communication; and
de-interleave second soft information associated with a second communication on a per segment basis, wherein one or more second sets of time domain resources associated with the second communication are associated with redundancy version indexes on a per segment basis.

23. The network entity of claim 22, wherein the one or more processors are further configured to:
transmit an indication of the one or more sets of time domain resources for the multi-slot transmission occasion.

24. The network entity of claim 22, wherein the one or more sets of time domain resources for the multi-slot transmission occasion consists of a single set of contiguous time domain resources that span across at least two slots.

25. The network entity of claim 22, wherein the first communication is a physical uplink shared channel (PUSCH) transmission that includes a single transport block, and wherein the multi-slot transmission occasion is a multi-slot PUSCH transmission occasion.

26. The network entity of claim 22, wherein the one or more sets of time domain resources are associated with redundancy version indexes on a per slot basis.

27. The network entity of claim 22, wherein de-interleaving is on a per slot basis, and wherein the one or more sets of contiguous time domain resources are associated with redundancy version indexes on a per transmission occasion basis or a per segment basis.

28. The network entity of claim 22, wherein redundancy version indexes are assigned on a per transmission occasion basis for the one or more sets of contiguous time domain resources associated with redundancy version indexes on a per slot basis.

* * * * *